(12) United States Patent
Liu et al.

(10) Patent No.: US 12,507,602 B2
(45) Date of Patent: Dec. 23, 2025

(54) RRAM WITH POST-PATTERNED TREATED MEMORY FILMS TO PROVIDE IMPROVED ENDURANCE CHARACTERISTICS AND METHODS FOR FORMING

(71) Applicant: Taiwan Semiconductor Manufacturing Company Limited, Hsinchu (TW)

(72) Inventors: Watson Liu, Hsinchu (TW); Fu-Ting Sung, Yangmei (TW); Hsia-Wei Chen, Taipei (TW); Yu-Wen Liao, New Taipei (TW); Wen-Ting Chu, Kaohsiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 602 days.

(21) Appl. No.: 17/887,614

(22) Filed: Aug. 15, 2022

(65) Prior Publication Data
US 2023/0371407 A1 Nov. 16, 2023

Related U.S. Application Data

(60) Provisional application No. 63/341,535, filed on May 13, 2022.

(51) Int. Cl.
*H10N 70/00* (2023.01)
*H10B 63/00* (2023.01)
*H10N 70/20* (2023.01)

(52) U.S. Cl.
CPC ........... *H10N 70/828* (2023.02); *H10B 63/30* (2023.02); *H10B 63/80* (2023.02); *H10N 70/041* (2023.02); *H10N 70/063* (2023.02); *H10N 70/24* (2023.02)

(58) Field of Classification Search
CPC .. H10N 70/828; H10N 70/24; H10N 70/8833; H10B 63/80
See application file for complete search history.

(56) References Cited

U.S. PATENT DOCUMENTS

| 9,461,245 B1 | 10/2016 | Yang et al. | |
| 2013/0010529 A1* | 1/2013 | Hayakawa | H10N 70/24 |
| | | | 257/E45.001 |

(Continued)

FOREIGN PATENT DOCUMENTS

| CN | 112310278 A | 2/2021 |
| DE | 102016117561 A1 | 5/2017 |

(Continued)

OTHER PUBLICATIONS

Korean Patent and Trademark Office; KR Application No. 10-2023-0061967; second Office Action mailed Apr. 16, 2025; 14 pages.

(Continued)

*Primary Examiner* — Shih Tsun A Chou
(74) *Attorney, Agent, or Firm* — The Marbury Law Group, PLLC

(57) ABSTRACT

A semiconductor structure includes a first electrode comprising a first metallic material; a memory film including at least one dielectric metal oxide material and contacting the first electrode; and a second electrode comprising a second metallic material and contacting the memory film. The memory film includes a center region having a first average atomic ratio of a passivation element to oxygen that is less than 0.01, and includes a peripheral region having a second average atomic ratio of the passivation element to oxygen that is greater than 0.05.

20 Claims, 29 Drawing Sheets

(56) References Cited

U.S. PATENT DOCUMENTS

| | | | | |
|---|---|---|---|---|
| 2014/0264237 | A1* | 9/2014 | Chen | H10N 70/20 |
| | | | | 257/4 |
| 2015/0364193 | A1* | 12/2015 | Shimakawa | G11C 13/0069 |
| | | | | 365/160 |
| 2016/0351806 | A1* | 12/2016 | Hsieh | H10N 70/068 |
| 2017/0053967 | A1* | 2/2017 | Chuang | H10N 50/01 |
| 2017/0141305 | A1* | 5/2017 | Yang | H10N 70/021 |
| 2018/0097173 | A1 | 4/2018 | Chuang et al. | |
| 2021/0013408 | A1 | 1/2021 | Pai et al. | |
| 2021/0135103 | A1* | 5/2021 | Wang | H10N 50/85 |
| 2021/0242400 | A1 | 8/2021 | Chen et al. | |
| 2023/0295798 | A1* | 9/2023 | Pape | C23C 16/4404 |
| | | | | 427/569 |

FOREIGN PATENT DOCUMENTS

| | | |
|---|---|---|
| DE | 102021111424 A1 | 12/2021 |
| JP | 2009021524 A | 1/2009 |
| JP | 2011071380 A | 4/2011 |
| JP | 2017092471 A | 5/2017 |
| KR | 20160091804 A | 8/2016 |
| KR | 20210092646 A | 7/2021 |
| TW | 202141791 A | 11/2021 |
| TW | 202205281 A | 2/2022 |
| TW | 202205707 A | 2/2022 |
| WO | 2012066786 A1 | 5/2012 |
| WO | 2012070238 A1 | 5/2012 |

OTHER PUBLICATIONS

TW Patent and Trademark Office; TW Application No. 112116512; first Office Action mailed Jul. 9, 2024; 12 pages.
JP Patent and Trademark Office; JP Application No. 2023-079496; first Office Action mailed Jul. 2, 2024; 14 pages.
German Patent and Trademark Office; DE Application No. 102023107680.9; first Examination Report mailed Aug. 5, 2024; 16 pages.
Korean Patent and Trademark Office; KR Application No. 10-2023-0061967; first Office Action mailed Aug. 14, 2024; 12 pages.

* cited by examiner

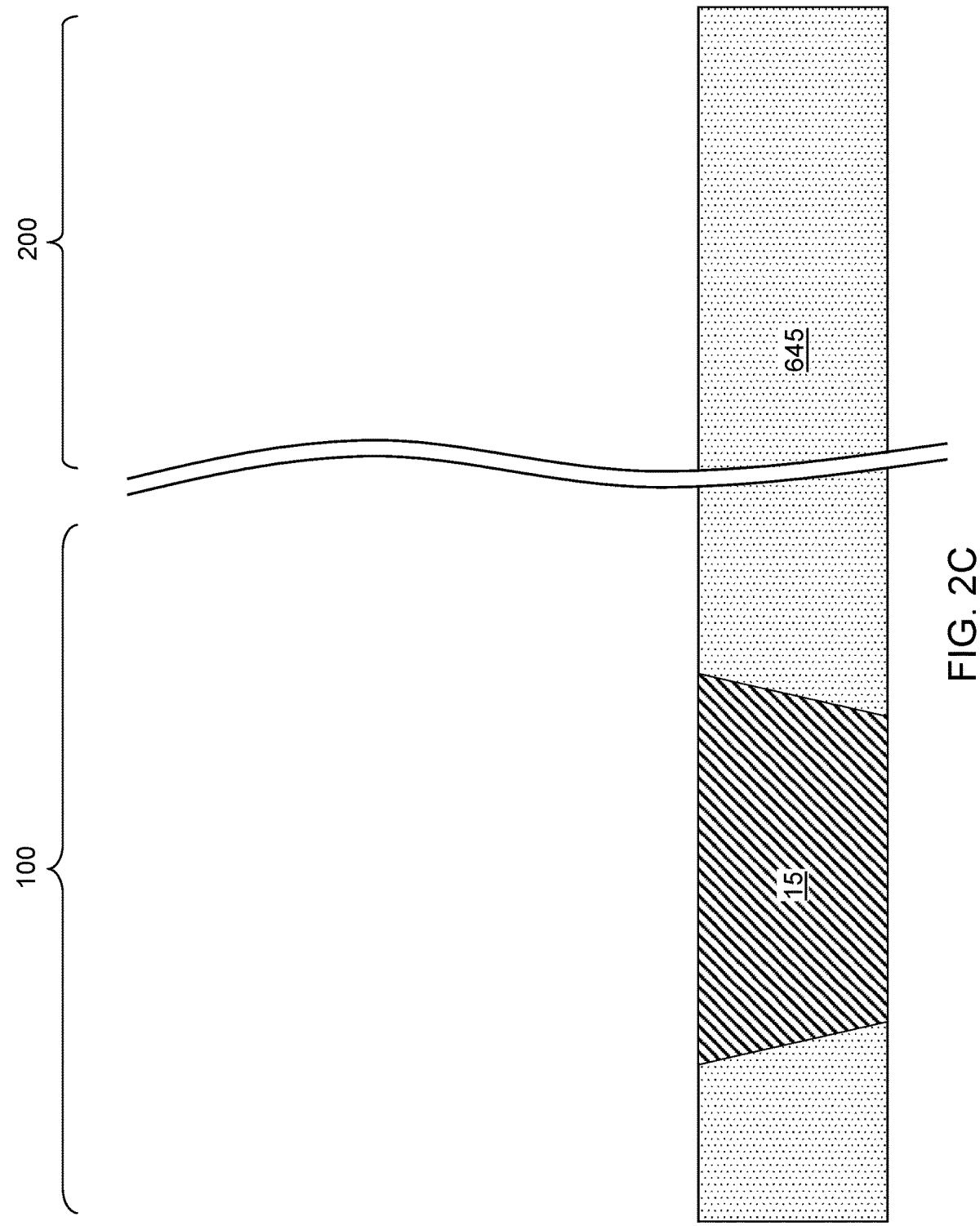

RRAM WITH POST-PATTERNED TREATED MEMORY FILMS TO PROVIDE IMPROVED ENDURANCE CHARACTERISTICS AND METHODS FOR FORMING

RELATED APPLICATIONS

This application claims the benefit of priority from U.S. provisional Application Ser. No. 63/341,535, titled "Etching Post Treatment in E-memory for Endurance Improvement," filed on May 13, 2022, the entire contents of which are incorporated herein by reference for all purposes.

BACKGROUND

Some types of resistive memory devices use a dielectric metal oxide material that forms conductive paths including oxygen vacancies. The conductive paths may be formed or erased by application of electrical bias across two electrodes that are provided on the dielectric metal oxide material, and may be used to store information by providing different resistance values between the two electrodes depending on the presence or absence of the conductive paths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a magnified view of region C in FIG. 2A.

DETAILED DESCRIPTION

Figure 1:
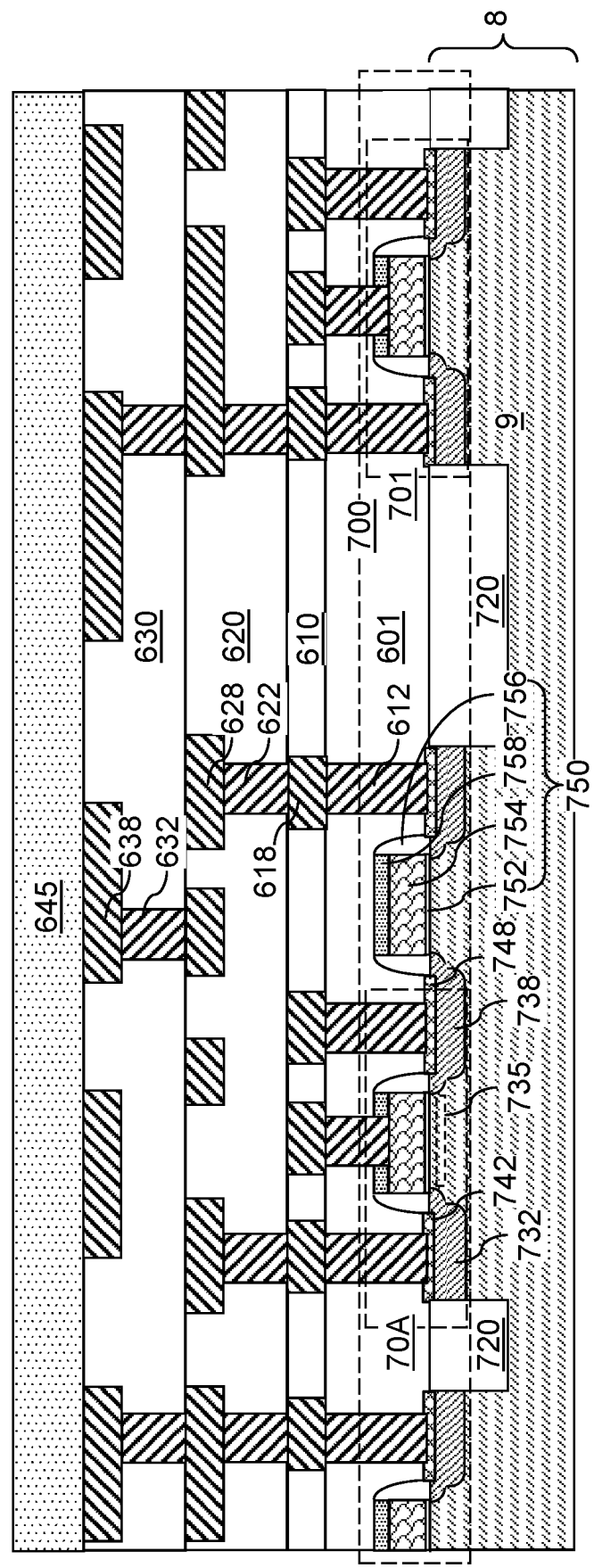
FIG. 1 is a vertical cross-sectional view of a first exemplary structure after formation of complementary metal-oxide-semiconductor (CMOS) transistors, lower-level metal interconnect structures formed in lower-level dielectric material layers, and a lower via-level dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A resistive memory cell includes a resistive memory material that varies its resistivity depending on programming conditions. One type of memory cells uses a high dielectric constant (high-k) metal oxide material that may form conductive filaments therein. The conductive filaments may comprise a continuous oxygen deficient region formed by migration of oxygen atoms. While such conductive filaments of oxygen vacancies may be considered crystallographic defects, such conductive filaments of oxygen vacancies may be programmed by the application of a suitable electrical bias voltage. In addition, such conductive filaments of oxygen vacancies may be erased by application of a reverse electrical bias voltage. Thus, presence or absence of conductive filaments of oxygen vacancies may be used to encode a binary data bit in a resistive memory cell.

During a manufacture process, physically exposed surface portions of a metal oxide material may be collaterally damaged by etchant ions, and provide conditions that are conductive to formation of oxygen deficient conductive filaments and are adverse to removal of oxygen deficient conductive filaments. Such surface portions may cause reduction in the endurance of resistive memory cells, for example, to less than 200,000 cycles of programming and erasure, and may cause an increase in the leakage current of the resistive memory cells.

Oxygen vacancy filaments may be easily formed at a location having the strongest electrical field. Simulations show that oxygen vacancy filaments may be easily formed on surface regions underneath sidewalls of a dielectric metal oxide film. While oxygen vacancies in a center region of the dielectric metal oxide material provide stable electrical characteristic for resistive memory devices, oxygen deficiencies formed on etched surfaces of a dielectric metal oxide material are prone to variations in electrical properties due to damages caused during an etch process, and increases the variability in the electrical characteristics of the resistive memory devices.

According to an aspect of the present disclosure, formation of oxygen vacancy filaments in surface regions of a dielectric metal oxide memory film outside of a programming voltage range due to crystallographic defects introduced during anisotropic etch processes may be suppressed by performing a plasma treatment using a fluorine-containing plasma or a nitrogen-containing plasma. A surface passivation layer is formed, which contains less oxygen than the center region of the dielectric metal oxide memory film. The surface passivation layer may, or may not, be free of oxygen. Formation of oxygen vacancy filaments is suppressed within the surface passivation layer. Endurance of memory cells may be enhanced, for example, above 100,000 programming and erasure cycles, and leakage current through the memory cells may be reduced due to lack of oxygen vacancy filaments in the surface regions of the memory films. While the present disclosure is described using a resistive memory cell, the structures and methods of the present disclosure may be applicable to conductive-bridge random access memory devices, and such applications are expressly contemplated herein. The various aspects of the present disclosure are now described in detail with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors (70A, 701) may be formed over the top surface of the semiconductor material layer 9. The field effect transistors (70A, 701) may comprise an array of access transistors 70A that are used to individually access each memory cell within a two-dimensional array of memory cells to be subsequently formed. Further, the field effect transistors (70A, 701) may comprise peripheral field effect transistors 701 within a peripheral circuit. For example, the peripheral field effect transistors 701 may comprise bit line drivers configured to apply a bit line bias voltage to bit lines to be subsequently formed, and sense amplifiers configured to detect electrical current that flows through the bit lines during a read operation.

For example, each field effect transistor (70A, 701) may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of memory cells may be subsequently formed. The first exemplary structure may further include a peripheral region 200 in which metal wiring for the array of memory devices is provided. Generally, the access transistors 70A in the CMOS circuitry 700 may be electrically connected to an electrode of a respective memory cell to be subsequently formed by a respective set of metal interconnect structures.

Devices (such as peripheral field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors (70A, 701) in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor (70A, 701) in the CMOS circuitry 700 may include a single crystalline semiconductor channel such as a single crystalline silicon channel. In one embodiment, a plurality of access transistors 70A in the CMOS circuitry 700 may include a respective node that is subsequently electrically connected to a node of a respective memory cell to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices thereupon (such as field effect transistors (70A, 701)). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, and third metal line structures 638 formed in an upper portion of the third interconnect-level dielectric material layer 630.

Each of the dielectric material layers (601, 610, 620, 630) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Likewise, the second metal via structures 632 and the third metal line structures 638 may be formed as integrated line and via structures by a dual damascene process. The dielectric material layers (601, 610, 620, 630) are herein referred to as lower-lower-level dielectric material layers. The metal interconnect structures (612, 618, 622, 628, 632, 638) formed within in the lower-level dielectric material layers are herein referred to as lower-level metal interconnect structures.

While the present disclosure is described using an embodiment in which an array of memory cells may be formed over the third line-and-via-level dielectric material layer 630, embodiments are expressly contemplated herein in which the array of memory cells may be formed at a different metal interconnect level.

In one embodiment, a planar dielectric material layer having a uniform thickness may be formed over the lower-level dielectric material layers (601, 610, 620, 630). The planar dielectric material layer is herein referred to as a lower via-level dielectric layer 645. The lower via-level dielectric layer 645 includes a dielectric material. In one embodiment, the lower via-level dielectric layer 645 may comprise an extremely low-k (ELK) dielectric material. In one embodiment, the lower via-level dielectric layer 645 comprises, and/or consists essentially of, at least one dielectric material selected from undoped silicate glass, a doped silicate glass, organosilicate glass, a porous dielectric material, silicon nitride, silicon oxynitride, silicon carbide, silicon oxycarbide, and silicon carbonitride. The lower via-level dielectric layer 645 may be deposited, for example, by chemical vapor deposition. The thickness of the lower via-level dielectric layer 645 may be in a range from 20 nm to 300 nm, although lesser and greater thicknesses may also be used.

Generally, metal interconnect structures (herein referred to as lower-level metal interconnect structures (612, 618, 622, 628, 632, 638)) embedded within interconnect-level dielectric layers (such as the lower-level dielectric material layer (601, 610, 620, 630)) may be formed over semiconductor devices. The lower via-level dielectric layer 645 may be formed over the interconnect-level dielectric layers.

Figure 2A:
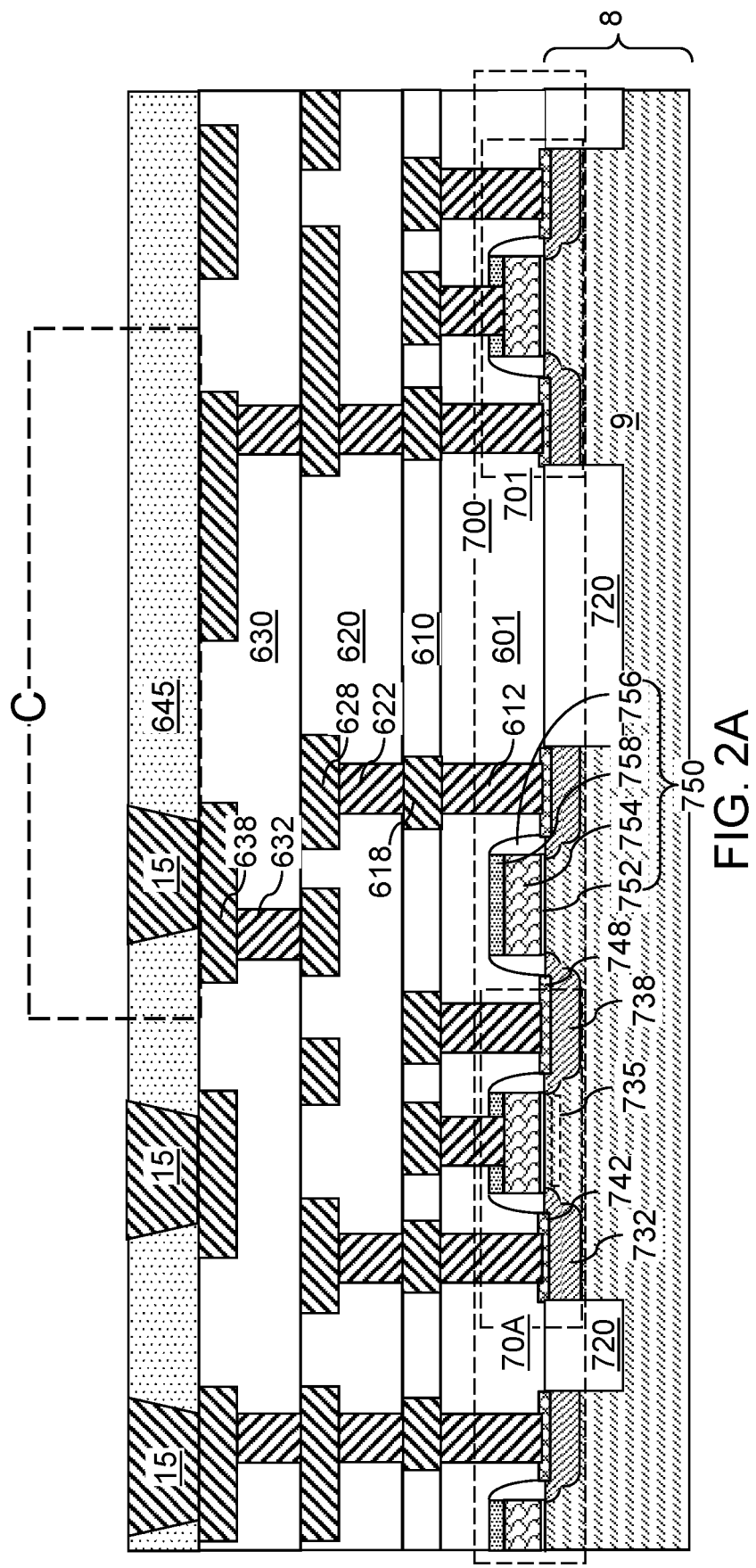
FIG. 2A is a vertical cross-sectional view of the first exemplary structure after formation of bottom connection via structures according to an embodiment of the present disclosure.
Figure 2B:
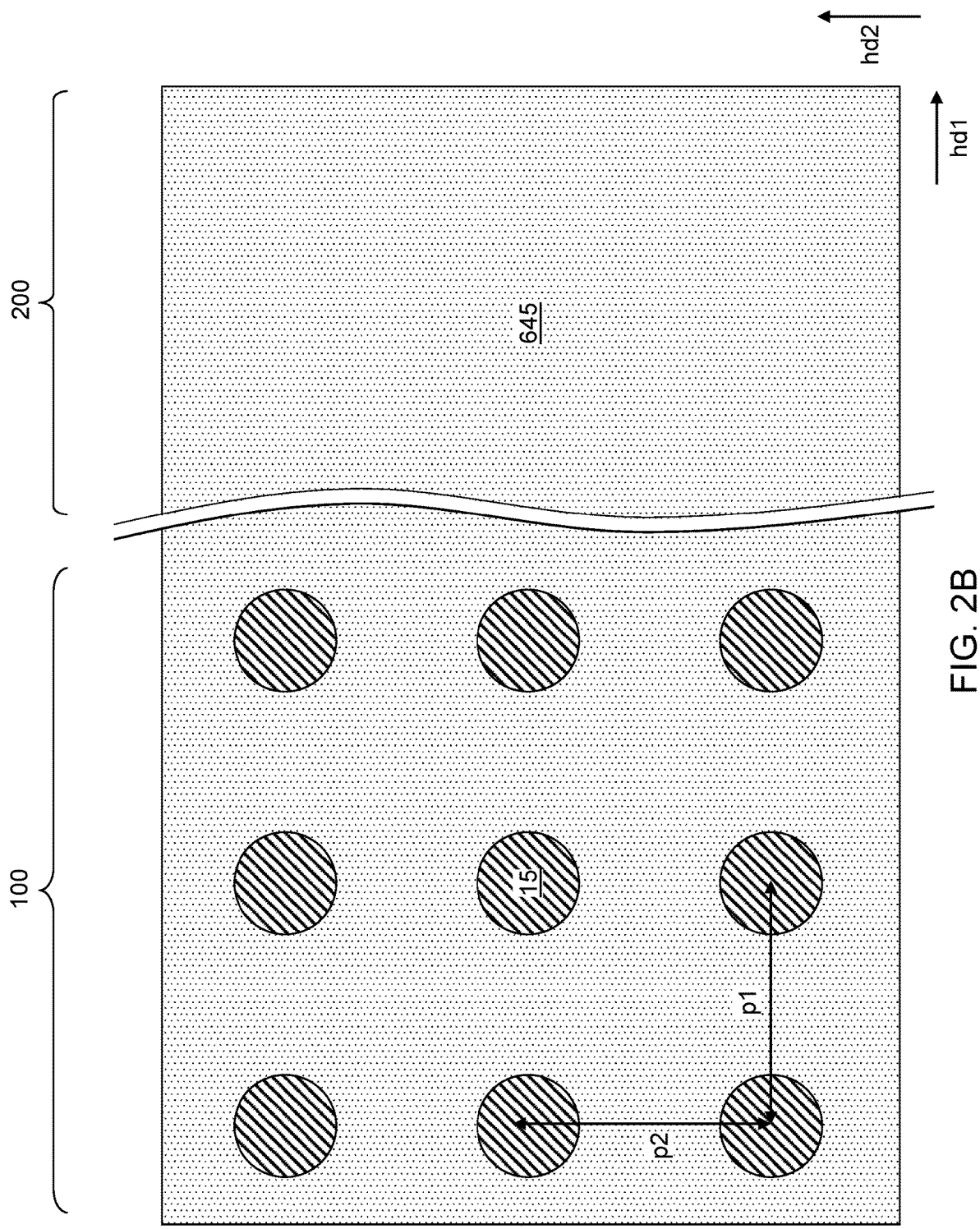
FIG. 2B is a top-down view of the first exemplary structure of FIG. 2A.

Referring to FIGS. 2A-2C, a photoresist layer (not shown) may be applied over the lower via-level dielectric layer 645, and may be lithographically patterned to form a two-dimensional array of openings. The two-dimensional array of openings may have a first pitch along a first horizontal direction hd1, and may have a second pitch along a second horizontal direction hd2. Each of the openings in the photoresist layer may have a horizontal cross-sectional shape of a circle, an oval, an ellipse, a rectangle, a rounded rectangle, or any other two-dimensional curvilinear shape having a closed periphery. An anisotropic etch process may be performed to transfer the pattern of the openings in the photoresist layer through the lower via-level dielectric layer 645. A top surface of a respective lower-level metal interconnect structure (such as a top surface of a respective third metal line structure 638 in the illustrated example) may be physically exposed at the bottom of each opening through the lower via-level dielectric layer 645. The photoresist layer may be subsequently removed, for example, by ashing.

The two-dimensional array of openings may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the lower via-level dielectric layer 645.

Each remaining portion of the at least one metallic material comprises a bottom connection via structure 15 in electrical contact with a respective lower-level metal interconnect structure (such as a top surface of a respective third metal line structure 638 in the illustrated example). A two-dimensional array of bottom connection via structures 15 may be formed within the lower via-level dielectric layer 645. Generally, the horizontal cross-sectional shape of each bottom connection via structure 15 may be any two-dimensional shape having a closed periphery. For example, the horizontal cross-sectional shapes of the bottom connection via structures 15 may be shapes of a circle, oval, ellipse, a rectangle, a rounded rectangle, or any two-dimensional curvilinear shape having a closed periphery. Other shapes are within the contemplated scope of disclosure. The top surfaces of the bottom connection via structures 15 may be coplanar with the top surface of the lower via-level dielectric layer 645. The periodicity of the bottom connection via structures 15 along the first horizontal direction hd1 may be the first pitch p1. The periodicity of the bottom connection via structures 15 along the second horizontal direction hd2 is herein referred to as a second pitch p2.

Figure 3:
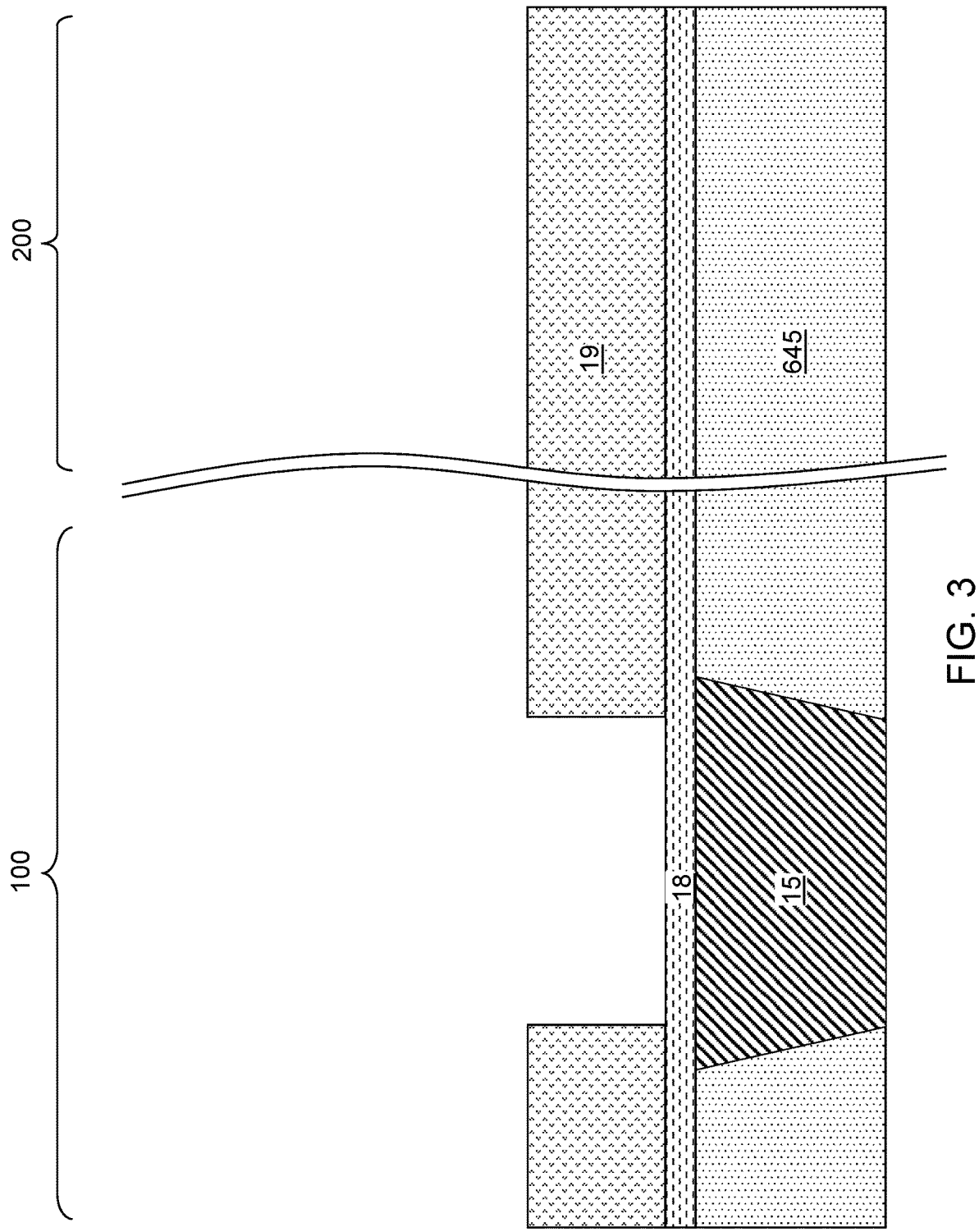
FIG. 3 is a vertical cross-sectional view of the magnified view of region C of the first exemplary structure after formation of an etch-stop dielectric material layer and a patterned photoresist layer according to an embodiment of the present disclosure.

Referring to FIG. 3, an etch-stop dielectric material layer 18 may be formed over the lower via-level dielectric layer 645. The etch-stop dielectric material layer 18 comprises a dielectric material that may be used as an etch stop structure for an anisotropic etch process to be subsequently used to pattern memory cells. In one embodiment, the etch-stop dielectric material layer 18 comprises, and/or consists essentially of, a material such as silicon carbide, silicon nitride, or silicon carbide nitride. In one embodiment, the etch-stop dielectric material layer 18 comprises, and/or consists essentially of, silicon carbide. The thickness of the etch-stop dielectric material layer 18 may be in a range from 3 nm to 60 nm, such as from 6 nm to 30 nm, although lesser and greater thicknesses may also be used. The etch-stop dielectric material layer 18 may be formed, for example, by chemical vapor deposition. Generally, the etch-stop dielectric material layer 18 is formed over metal interconnect structures (612, 618, 622, 628, 632, 638, 15).

A photoresist layer 19 may be applied over the etch-stop dielectric material layer 18, and may be lithographically patterned to form a periodic two-dimensional array of openings therein. Each opening in the photoresist layer 19 may be formed within the area of a top surface of a respective underlying bottom connection via structure 15. The periodic two-dimensional array of openings may have the same periodicity as the two-dimensional array of bottom connection via structures 15.

Figure 4:
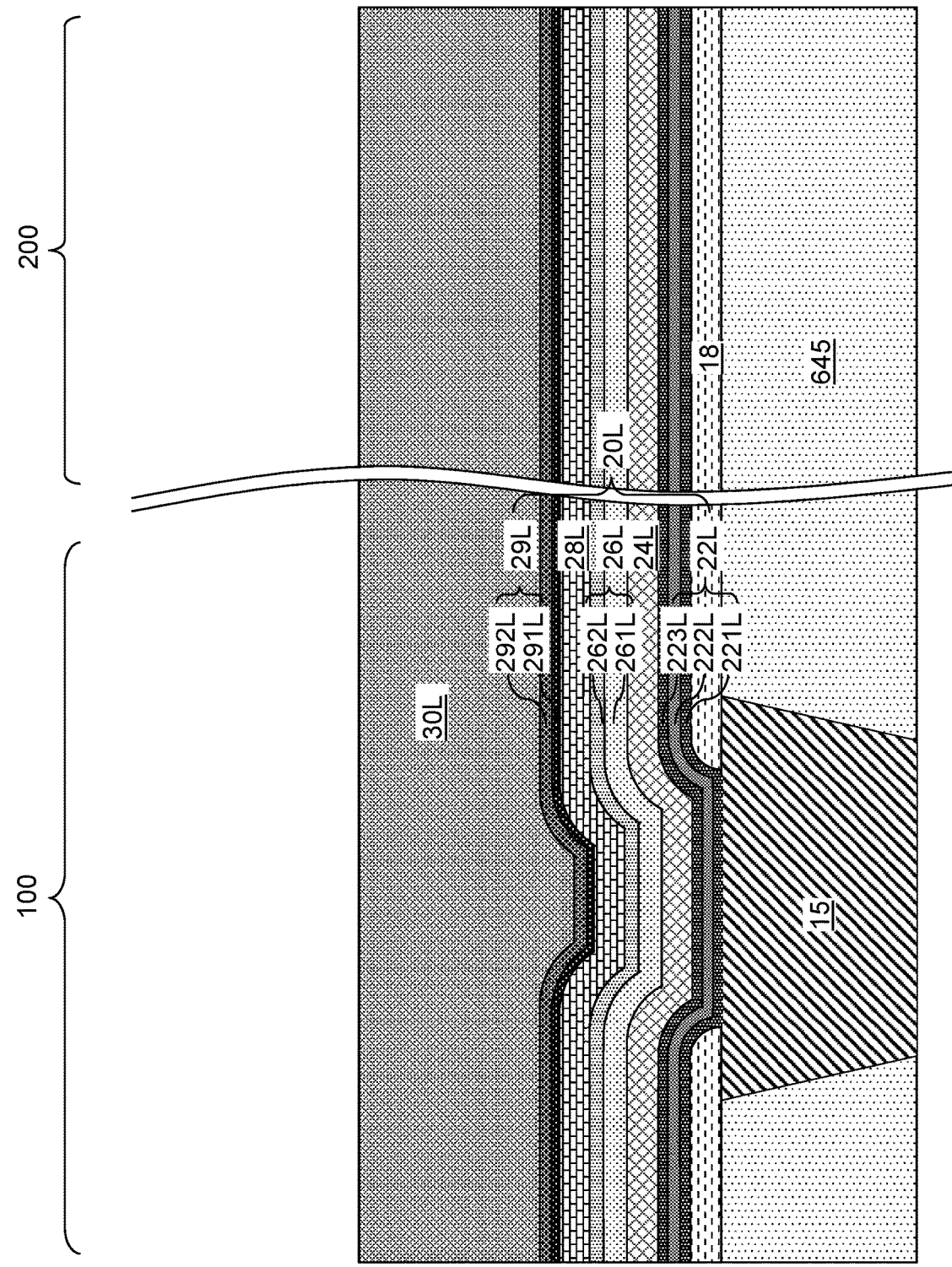
FIG. 4 is a vertical cross-sectional view of the magnified view of region C of the first exemplary structure after patterning the etch etch-stop dielectric material layer and depositing a layer stack including at least one bottom metallic barrier layer, a bottom electrode layer, at least one dielectric metal oxide layer, a top electrode layer, at least one top metallic barrier layer, and a hard mask layer according to an embodiment of the present disclosure.

Referring to FIG. 4, an anisotropic etch process may be performed to transfer the pattern of the openings in the photoresist layer 19 through the etch-stop dielectric material layer 18. A two-dimensional array of openings may be formed through the etch-stop dielectric material layer 18. The photoresist layer 19 may be subsequently removed, for example, by ashing. A top surface of a bottom connection via structure 15 may be physically exposed at the bottom of each opening through the etch-stop dielectric material layer 18.

A layer stack of material layers may be subsequently deposited over the etch-stop dielectric material layer 18 and the physically exposed surfaces of the bottom connection via structures 15. According to an aspect of the present disclosure, the layer stack may comprise, from bottom to top, at least one optional bottom metallic barrier layer 22L, a first electrode layer 24L, a memory film material layer 26L, a second electrode layer 28L, at least one optional top metallic barrier layer 29L, and a hard mask layer 30L. Collectively, the layer stack comprising at least one optional bottom metallic barrier layer 22L, a first electrode layer 24L, a memory material layer 26L, a second electrode layer 28L, at least one optional top metallic barrier layer 29L may represent a memory cell stack 20L.

The at least one optional bottom metallic barrier layer 22L comprises at least one metallic barrier material such as titanium nitride, tantalum nitride, tungsten nitride, molybdenum nitride, titanium, tantalum, and/or tungsten. In an illustrative example, the at least one optional bottom metallic barrier layer 22L may comprises a layer stack including, from bottom to top, a first bottom metallic barrier layer 221L, a second bottom metallic barrier layer 222L, and a third bottom metallic barrier layer 223L. In an illustrative example, the first bottom metallic barrier layer 221L may comprise titanium nitride, the second bottom metallic barrier layer 222L may comprise tantalum, and the third bottom metallic barrier layer 223L may comprise tantalum nitride. The total thickness of the at least one bottom metallic barrier layer 22L may be in a range from 3 nm to 60 nm, such as from 6 nm to 30 nm, although lesser and greater thicknesses may also be used. Each of the at least one bottom metallic barrier layer 22L may be deposited by physical vapor deposition or chemical vapor deposition.

The first electrode layer 24L (which may also be referred to as a bottom electrode layer) comprises a metallic material such as titanium nitride, tantalum, tungsten, platinum, ruthenium, iridium, molybdenum, niobium, rhenium, osmium, or another elemental metal having a melting temperature greater than 1,500 degrees Celsius. The thickness of the first electrode layer 24L may be in a range from 3 nm to 60 nm, such as from 6 nm to 30 nm, although lesser and greater thicknesses may also be used. The first electrode layer 24L may be deposited by physical vapor deposition or chemical vapor deposition.

The memory material layer 26L includes at least one dielectric metal oxide layer (261L, 262L). According to an aspect of the present disclosure, each of the at least one dielectric metal oxide layer (261L, 262L) comprises, and/or consists essentially of, at least one filament-forming dielectric metal oxide material. As used herein, a filament-forming dielectric metal oxide material refers to a dielectric metal oxide material that is capable of forming filaments of oxygen-deficient regions (i.e., oxygen-deficiency filaments) upon application of an electrical bias that generates an electrical field having a magnitude that is greater than a respective threshold electrical field strength. In one embodiment, each of the at least one filament-forming dielectric metal oxide material in the at least one dielectric metal oxide layer (261L, 262L) is a non-stoichiometric oxygen-deficient dielectric metal oxide material.

In the illustrative example, the at least one dielectric metal oxide layer (261L, 262L) may comprise a layer stack of a first dielectric metal oxide layer 261L and a second dielectric metal oxide layer 262L. The first dielectric metal oxide layer 261L comprises, and/or consists essentially of, a first dielectric metal oxide material comprising a dielectric metal oxide of at least one first metal. The second dielectric metal oxide layer 262L comprises, and/or consists essentially of, a second dielectric metal oxide material comprising a dielectric metal oxide of at least one second metal. The second dielectric metal oxide material may be different in material composition than the first dielectric metal oxide material. In one embodiment, the at least one second metal is different from the at least one first metal by presence of a metallic element that is not present in the at least one first metal, or by absence of a metallic element that is present in the at least one first metal.

In one embodiment, one, a plurality, and/or each of the dielectric metal oxide material in the at least one dielectric metal oxide layer (261L, 262L) may comprise, and/or may consist of, a respective filament-forming metal oxide material that is a binary oxide material, i.e., a compound of a single metal element and oxygen. For example, one, a plurality, and/or each of the dielectric metal oxide material in the at least one dielectric metal oxide layer (261L, 262L) may comprise, and/or may consist of, a material selected from $HfO_{2(1-\alpha)}$, $Ta_2O_{5(1-\beta)}$, and $Y_2O_{3(1-\gamma)}$. In this embodiment, each of a, B, and y may be independently in a range from $1.0 \times 10^{-6}$ to $1.0 \times 10^{-1}$.

In one embodiment, one, a plurality, and/or each of the dielectric metal oxide material in the at least one dielectric metal oxide layer (261L, 262L) may comprise, and/or may consist of, a respective filament-forming metal oxide material that is a ternary oxide material, i.e., a compound of two metal elements and oxygen. Non-limiting examples of such ternary filament-forming metal oxide material comprise hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), a doped $HfO_2$ (including a dopant selected from Si, Zr, Y, Al, Gd, Sr, La, Sc, Ge, etc.), and alloys of $HfO_{2(1-\alpha)}$, $Ta_2O_{5(1-\beta)}$, and $Y_2O_{3(1-\gamma)}$.

In one embodiment, a plurality, and/or each of the dielectric metal oxide material in the at least one dielectric metal oxide layer (261L, 262L) may comprise, and/or may consist of, a respective filament-forming metal oxide material that is a quaternary oxide material, i.e., a compound of three metal elements and oxygen. Non-limiting examples of such quaternary filament-forming metal oxide material comprise lead zirconate titanate (PZT: $PbZrxTiyOz$), barium strontium titanate ($BaSrTiOx$), strontium bismuth tantalate (SBT: $SrBi_2Ta_2O_9$), and alloys of previously listed binary filament-forming metal oxide materials and/or ternary filament-forming metal oxide materials.

Generally, the at least one dielectric metal oxide layer (261L, 262L) as formed at this processing step may be free of fluorine atoms and nitrogen atoms, and/or may comprise fluorine atoms or nitrogen atoms only at a trace level (such as less than 0.1 part per million in atomic concentration). The at least one dielectric metal oxide layer (261L, 262L) may be formed by any suitable deposition process known in the art such as physical vapor deposition or chemical vapor deposition. The thickness of the memory material layer 26L may be in a range from 4 nm to 60 nm, such as from 6 nm to 30 nm, although lesser and greater thicknesses may also be used. In embodiments in which the memory material layer comprises a layer stack of multiple dielectric metal oxide layers such as a layer stack of a first dielectric metal oxide layer 261L and a second dielectric metal oxide layer 262L, the thickness of each dielectric oxide layer (261L or 262L) may be in a range from 1 nm to 50 nm, although lesser and greater thicknesses may also be used.

The second electrode layer 28L (which may also be referred to as a top electrode layer) comprises a metallic material such as titanium nitride, tantalum, tungsten, platinum, ruthenium, iridium, molybdenum, niobium, rhenium, osmium, or another elemental metal having a melting temperature greater than 1,500 degrees Celsius. The thickness of the second electrode layer 28L may be in a range from 3 nm to 60 nm, such as from 6 nm to 30 nm, although lesser and greater thicknesses may also be used. The second electrode layer 28L may be deposited by physical vapor deposition or chemical vapor deposition.

The at least one optional top metallic barrier layer 29L comprises at least one metallic barrier material such as titanium nitride, tantalum nitride, tungsten nitride, molybdenum nitride, titanium, tantalum, and/or tungsten. In an illustrative example, the at least one optional top metallic barrier layer 29L may comprises a layer stack including, from bottom to top, a first top metallic barrier layer 291L and a second top metallic barrier layer 292L. In an illustrative example, the first top metallic barrier layer 291L may comprise titanium nitride, the second top metallic barrier layer 292L may comprise tantalum nitride. The total thickness of the at least one top metallic barrier layer 29L may be in a range from 3 nm to 60 nm, such as from 6 nm to 30 nm, although lesser and greater thicknesses may also be used.

Each of the at least one top metallic barrier layer 29L may be deposited by physical vapor deposition or chemical vapor deposition.

A hard mask layer 30L may be deposited over the at least one optional top metallic barrier layer 29L. The hard mask layer 30L includes a material that may protect underlying material layers during a subsequent anisotropic etch process. The hard mask layer 30L may comprise a metallic material such a titanium nitride, or may comprise a dielectric material such as silicon oxide, silicon nitride, silicon carbon nitride, silicon oxynitride, and/or a dielectric metal oxide (such as, but not limited to, titanium oxide and aluminum oxide). The thickness of the hard mask layer 30L may be in a range from 20 nm to 200 nm, such as from 30 nm to 100 nm, although lesser and greater thicknesses may also be used. The hard mask layer 30L may be deposited by chemical vapor deposition or physical vapor deposition.

One, a plurality, and/or each, of the layers within the layer stack (i.e., 22L, 24L, 26L, 28L, 29L, 30L) may be formed with a conformal profile that provides convex surface segments around each opening in the etch-stop dielectric material layer 18.

Figure 5:
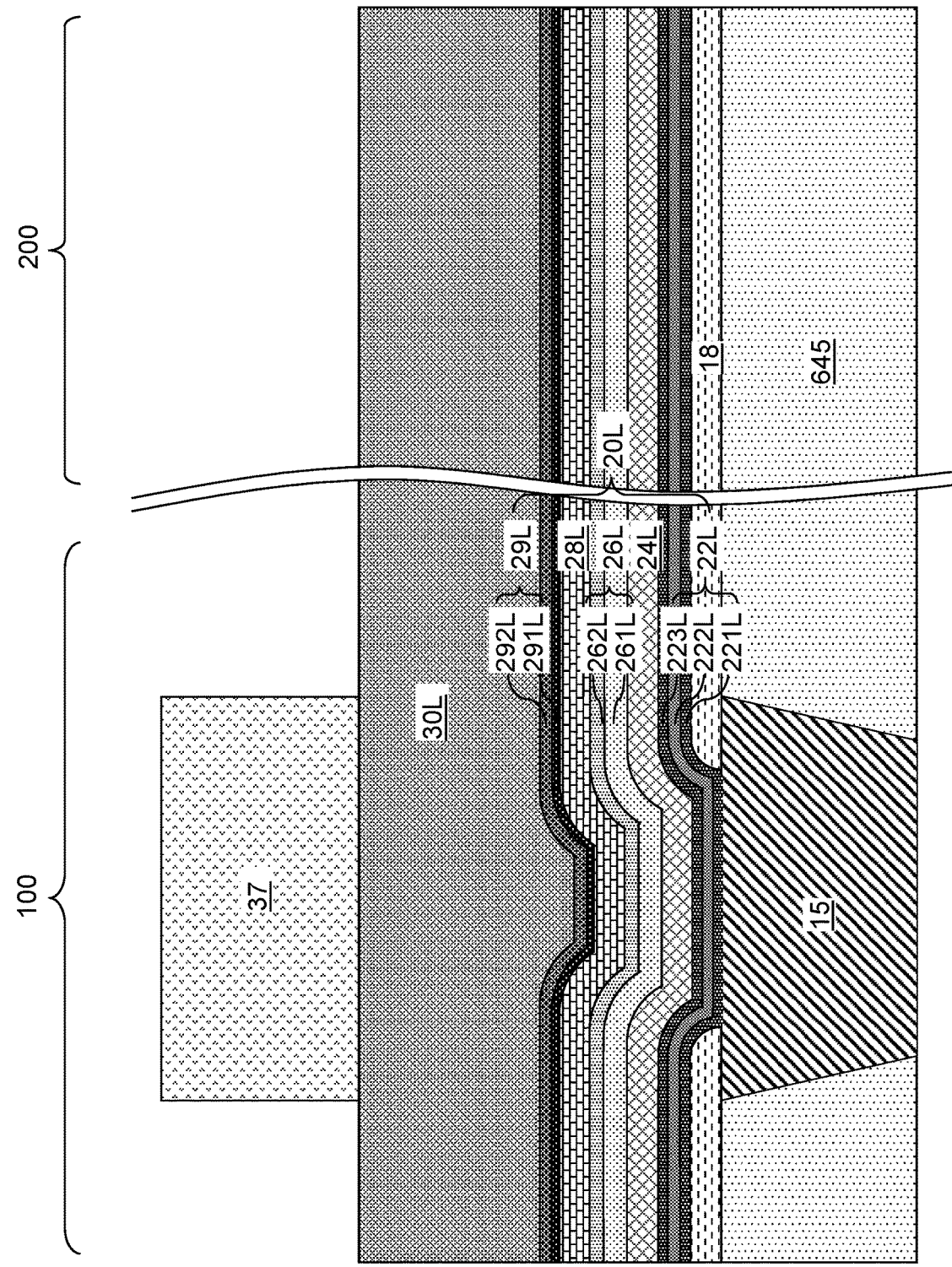
FIG. 5 is a vertical cross-sectional view of the magnified view of region C of the first exemplary structure after formation of a patterned photoresist layer according to an embodiment of the present disclosure.

Referring to FIG. 5, a photoresist layer may be applied over the hard mask layer 30L and may be lithographically patterned to form a patterned photoresist layer 37. The patterned photoresist layer 37 may comprise a two-dimensional periodic array of discrete photoresist material portions that overlie a respective one of the bottom connection via structures 15. As such, the two-dimensional periodic array of discrete photoresist material portions may have the same two-dimensional periodicity as the two-dimensional array of bottom connection via structures 15. Each of the discrete photoresist material portions may have an areal overlap with a respective underlying opening in the etch-stop dielectric material layer 18. In one embodiment, each of the discrete photoresist material portion may have a periphery that is laterally offset outward with respect to a periphery of an underlying opening in the etch-stop dielectric material layer 18 in a plan view (i.e., a top-down view).

Figure 6A:
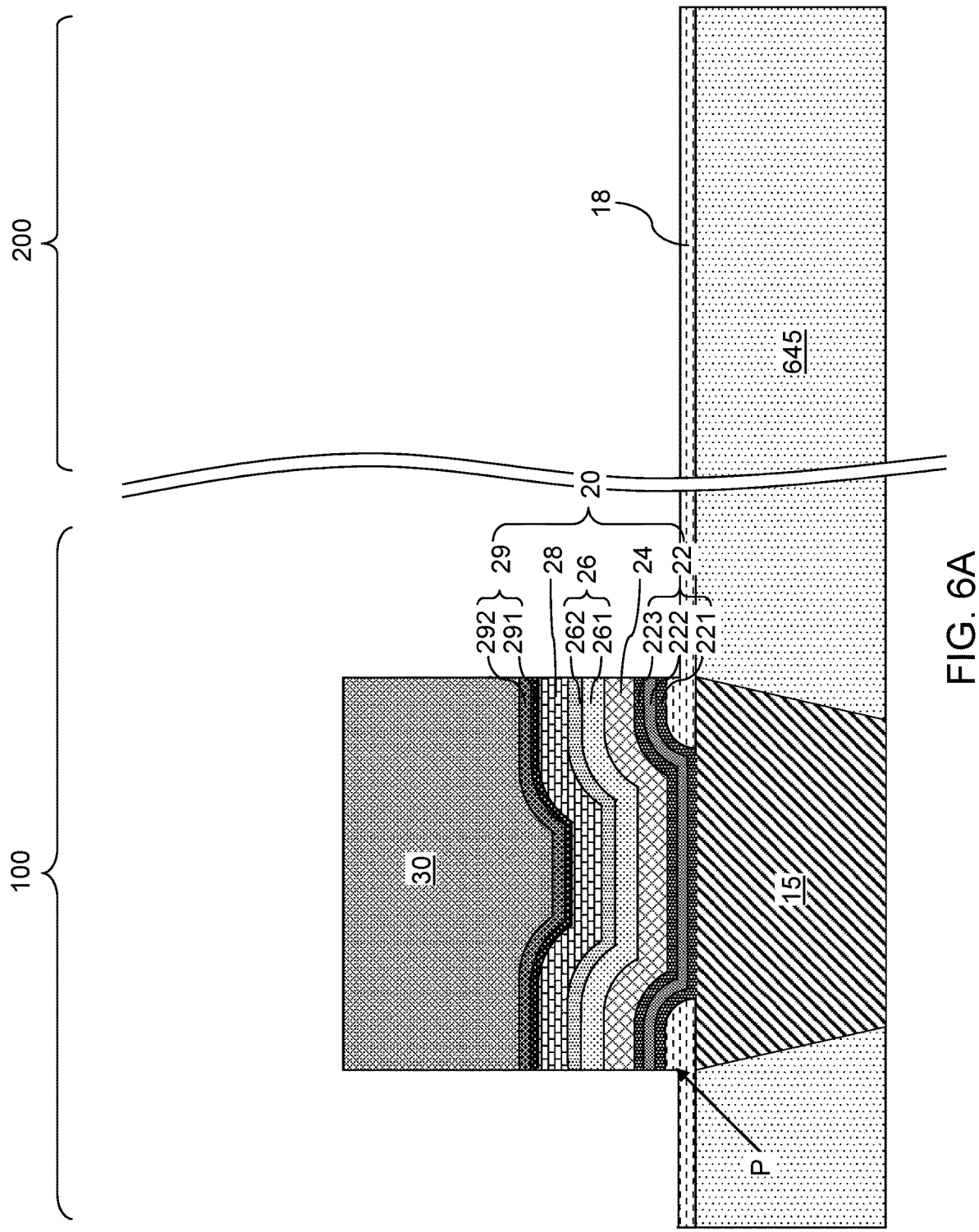
FIG. 6A is a vertical cross-sectional view of the magnified view of region C including a memory cell of the first exemplary structure after formation of an array of memory cells according to an embodiment of the present disclosure.
Figure 6B:
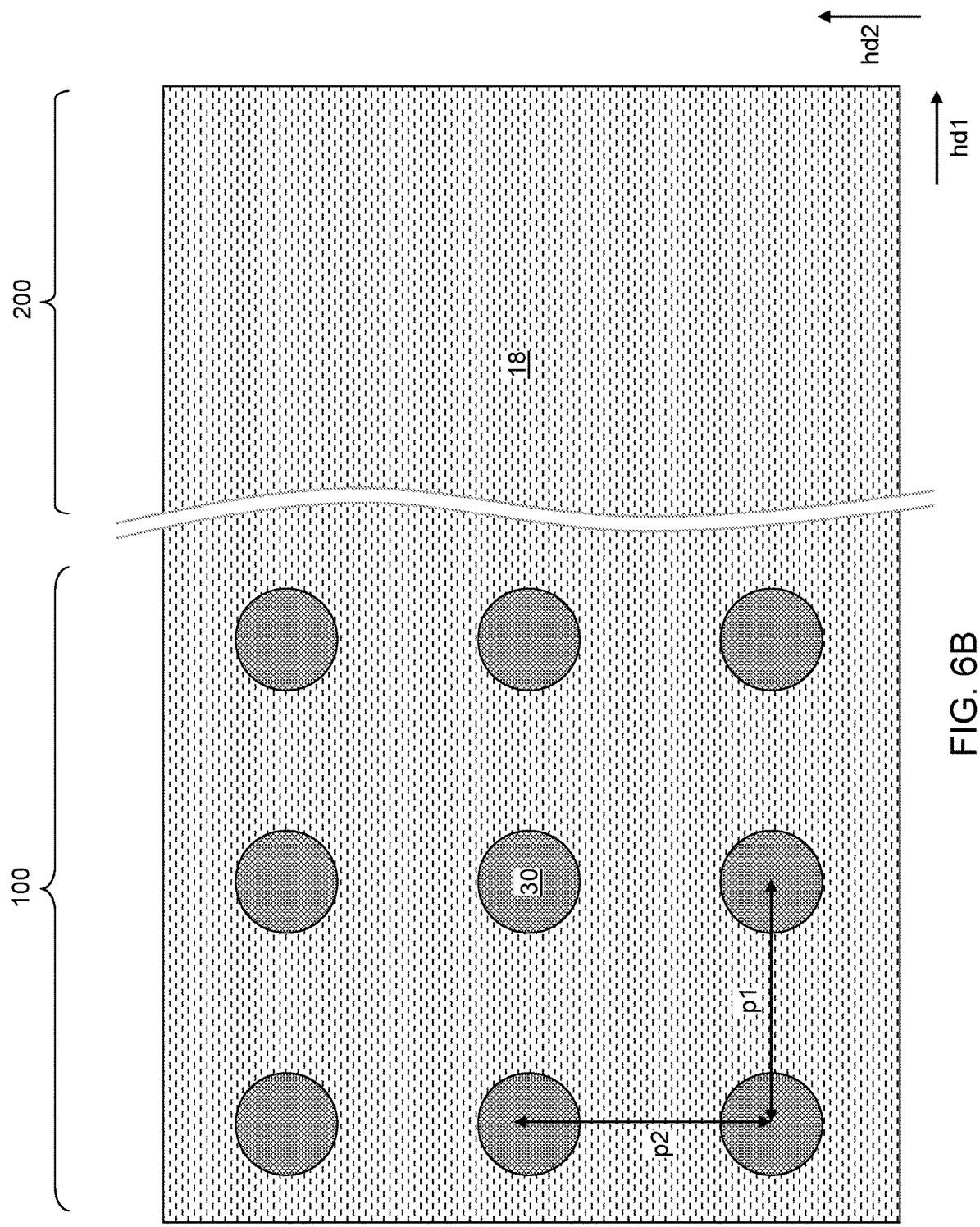
FIG. 6B is a top-down view of the first exemplary structure at the processing steps of FIG. 6A.

Referring to FIGS. 6A and 6B, the pattern of the two-dimensional array of discrete photoresist material portions of the patterned photoresist layer 37 may be transferred through the hard mask layer 30L by performing a first anisotropic etch process. The hard mask layer 30L may be patterned into a two-dimensional array of hard mask caps 30 by the first anisotropic etch process. The patterned photoresist layer 37 may be subsequently removed, for example, by ashing. Alternatively, the patterned photoresist layer 37 may be collaterally consumed during the first anisotropic etch process. Yet alternatively, first portions of the patterned photoresist layer 37 may be collaterally consumed during the first anisotropic etch process, and remaining portions of the patterned photoresist layer 37 may be removed during a subsequent second anisotropic etch process.

A second anisotropic etch process may be performed to transfer the pattern in the two-dimensional array of hard mask caps 30 through the at least one optional top metallic barrier layer 29L, the second electrode layer 28L, the memory material layer 26L, the first electrode layer 24L, and the at least one optional bottom metallic barrier layer 22L. Each patterned portion of the at least one optional top metallic barrier layer 29L (if used) comprises at least one optional top metallic barrier plate 29. Each patterned portion of the second electrode layer 28L comprises a second electrode 28. Each patterned portion of the memory material layer 26L comprises a memory film 26. Each patterned portion of the first electrode layer 24L comprises a first electrode 24. Each patterned portion of the at least one optional top metallic barrier layer 22L (if used) comprises at least one optional bottom metallic barrier plate 22.

In one embodiment, the optional bottom metallic barrier plate 22 may comprise a stack of a first bottom metallic barrier plate 221 (which is a patterned portion of the first bottom metallic barrier layer 221L), a second bottom metallic barrier plate 222 (which is a patterned portion of the second bottom metallic barrier layer 222L), and a third bottom metallic barrier plate 223 (which is a patterned portion of the third bottom metallic barrier layer 223L). The memory film 26 includes at least one dielectric metal oxide layer including an oxygen-deficient filament-forming dielectric metal oxide material. For example, the memory film 26 may comprise a layer stack including a first dielectric metal oxide layer 261 (which is a patterned portion of the first dielectric metal oxide layer 261L as formed at the processing steps of FIG. 4) and a second dielectric metal oxide layer 262 (which is a patterned portion of the second dielectric metal oxide layer 262L as formed at the processing steps of FIG. 4). In one embodiment, the optional top metallic barrier plate 29 may comprise a stack of a first top metallic barrier plate 291 (which is a patterned portion of the first top metallic barrier layer 291L), and a second top metallic barrier plate 292 (which is a patterned portion of the second top metallic barrier layer 292L).

Generally, portions of the second electrode layer 28L, the memory material layer 26L, and the first electrode layer 24L that are located outside the areas of the patterned etch mask layer 37 may be anisotropically etched during the second anisotropic etch process. Remaining portions of the second electrode layer 28L, the memory material layer 26L, and the first electrode layer 24L comprise second electrodes 28, memory films 26, and first electrodes 24.

Each contiguous set of at least one optional bottom metallic barrier plate 22, a first electrode 24, a memory film 26, a top electrode 28, and at least one optional top metallic barrier plate 29 constitutes a memory cell 20. A two-dimensional periodic array of memory cells 20 may be formed. The two-dimensional periodic array of memory cells 20 may have the first pitch p1 along the first horizontal direction hd1, and the second pitch p2 along the second horizontal direction hd2. In one embodiment, each first interface between a memory film 26 and a first electrode 24 may comprise a horizontal central segment, a contoured annular segment in which a convex surface of the first electrode 24 contacts a concave surface of the memory film 26, and a horizontal annular segment adjoined to an outer periphery of the contoured annular segment. Each second interface between a memory film 26 and a second electrode 28 may comprise a horizontal central segment, a contoured annular segment in which a concave surface of the second electrode 28 contacts a convex surface of the memory film 26, and a horizontal annular segment adjoined to an outer periphery of the contoured annular segment.

In one embodiment, all sidewalls of elements within a memory cell 20 may be vertically coincident, i.e., may be located within a same vertical plane. Thus, within each memory cell 20, a sidewall or sidewalls of at least one optional bottom metallic barrier plate 22, a sidewall or sidewalls of a first electrode 24, a sidewall or sidewalls of a memory film 26, a sidewall or sidewalls of a top electrode 28, and a sidewall or sidewalls of at least one optional top metallic barrier plate 29 may be vertically coincident. In an illustrative embodiment in which a memory cell 20 has a horizontal cross-sectional shape of a circle, the vertical plane may be a cylindrical vertical plane.

In one embodiment, the second anisotropic etch process may utilize an etch chemistry that is selective to the material of the etch-stop dielectric material layer 18. However, a collateral etching of a top portion of the etch-stop dielectric material layer 18 may occur at a terminal portion of the second anisotropic etch process. In one embodiment, the etch-stop dielectric material layer 18 underlies each of the first electrodes 24, and comprises a horizontally-extending portion and a two-dimensional array of vertically protruding portions. Each of the vertically-protruding portions comprises a sidewall that is vertically coincident with a sidewall of a first electrode 24 and has a bottom periphery P that is adjoined to a periphery of the horizontally-extending portion. The etch-stop dielectric material layer 18 comprises an opening therethrough within an area of each of the first electrodes 24 in a plan view.

Generally, each memory film 26 comprises at least one non-stoichiometric oxygen-deficient dielectric metal oxide material as provided in the memory material layer 26L. However, the physically exposed surface of the memory films 26 may contain structural and/or compositional defects that are introduced during the second anisotropic etch process. Some of such defects provide conditions that are conductive to premature formation of oxygen deficiency filaments, for example, under an electrical field having a magnitude that is less than a threshold field magnitude, and are adverse to removal of oxygen deficiency filaments (and thus, does not fully remove the oxygen deficiency filaments even if an electrical field that should be sufficient to erase oxygen deficiency filaments for defect-free dielectric metal oxides is applied). Further, such defects function as leakage paths for the memory cells 20 under normal operating conditions.

Figure 7:
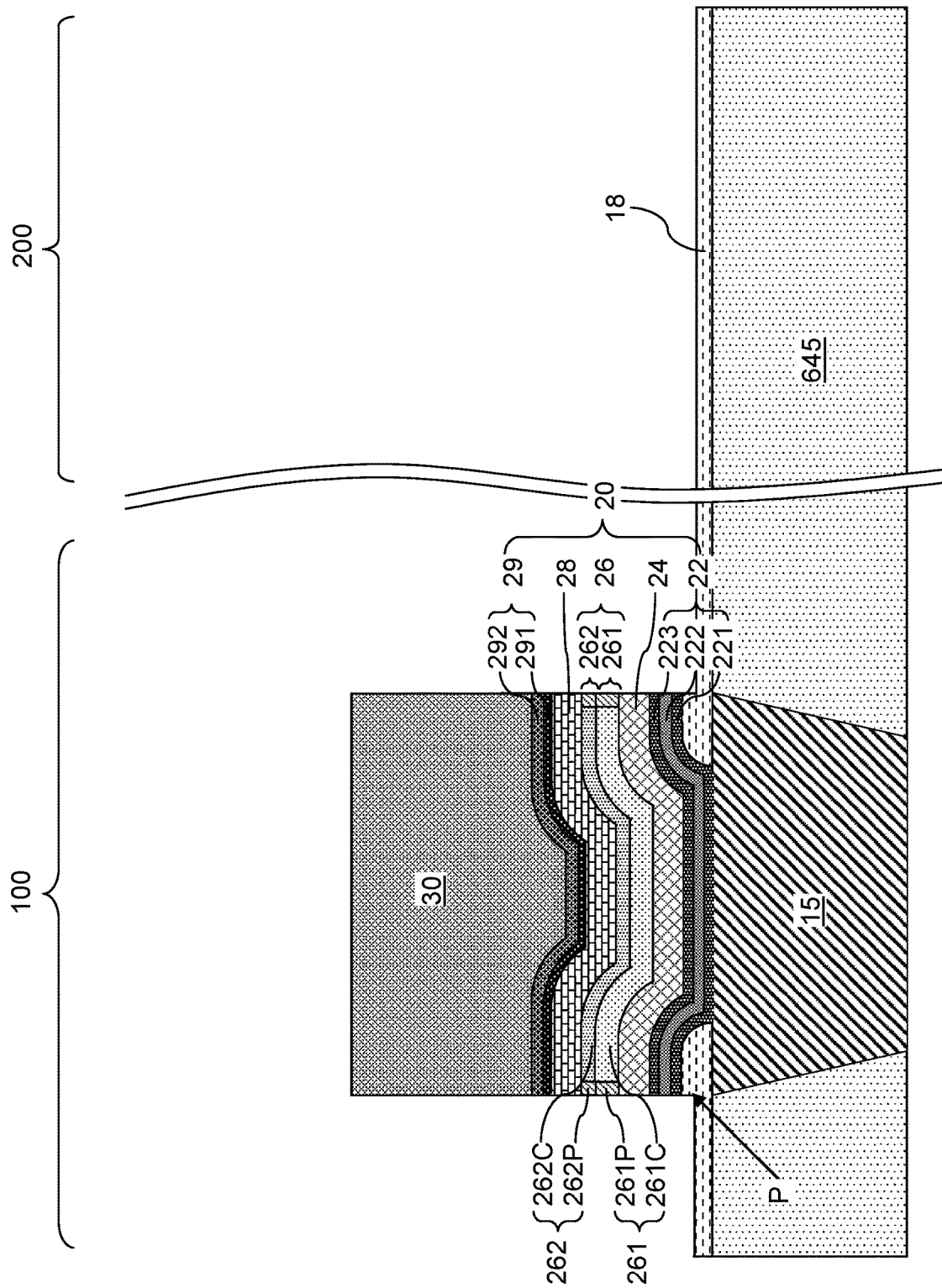
FIG. 7 is a vertical cross-sectional view of the magnified view of region C including a memory cell of the first exemplary structure after performing a passivation plasma treatment process according to an embodiment of the present disclosure.

Referring to FIG. 7 and according to an aspect of the present disclosure, a passivation plasma treatment process may be performed to passivate the surface regions of the memory films 26. Defects that are induced during the second anisotropic etch process are passivated by replacement of oxygen atoms with passivation elements that are provided during the passivation plasma treatment process. In one embodiment, the passivation plasma treatment process uses a fluorine gas plasm or a nitrogen gas plasma. The gas plasma treatment temperature may be, for example, in a range from 40° C. to 75° C., although lower and higher plasma treatment temperatures may also be used. The gas plasma power depends on the size of a semiconductor wafer that is processed in the process chamber, and may be generally in a range from 200 Watts to 1,500 Watts, although lower and higher gas plasma powers may also be used. Fluorine gas or nitrogen gas may be flowed into the process chamber during the passivation plasma treatment process. The gate flow rate during the passivation plasma treatment process may be in range from 10 standard cubit centimeters per minute (sccm) to 200 sccm, although lower and higher gate flow rates may also be used.

Generally, the material of the memory films 26 and the species of the gas in the gas plasma may be selected such that the atomic bonding strength between the metal element(s) in the memory films 26 and fluorine atoms or oxygen atoms provided from the gas plasma is greater than the atomic bonding strength between the metal elements and oxygen atoms. Thus, upon replacement of the oxygen atoms with fluorine atoms or nitrogen atoms in the surface portions of the memory films 26 during the passivation plasma treatment process, the fluorine atoms or the nitrogen atoms in the surface portions of the memory films 26 are not replaced with oxygen atoms even if the memory films 26 are exposed to the atmospheric ambient that includes oxygen after the passivation plasma treatment process.

Each memory film 26 includes a center region (261C, 262C) in which the material composition is not substantially affected by the passivation plasma treatment, and a peripheral region (261P, 262P) in which the passivation plasma treatment process replaced oxygen atoms with fluorine atoms or nitrogen atoms at a substantial fraction. The average atomic ratio of a passivation element (which may be fluorine or nitrogen) to oxygen in the peripheral region (261P, 262P) increases from a first number that is less than 0.01 (and/or less than 0.001, and/or less than 0.0001, and/or less than $1.0 \times 10^{-5}$, and/or less than $1.0 \times 10^{-6}$, and/or less than $1.0 \times 10^{-7}$) to a second number greater than 0.05 (and/or greater than 0.10, and/or greater than 0.10, and/or greater than 0.5, and/or greater than 1.0, and/or greater than 2, and/or greater than 5, and/or greater than 10). In one embodiment, the average atomic ratio of the passivation element (i.e., fluorine atoms or nitrogen atoms) to oxygen in each peripheral region (261P, 262P) of each memory film 26 may be greater than 0.05, and/or greater than 0.10, and/or greater than 0.5, and/or greater than 1.0, and/or greater than 2, and/or greater than 5, and/or greater than 10. In one embodiment, the center region (261C, 262C) of each memory film 26 may have an average atomic ratio of the passivation element to oxygen that is less than 0.01 (and/or less than 0.001, and/or less than 0.0001, and/or less than $1.0 \times 10^{-5}$, and/or less than $1.0 \times 10^{-6}$, and/or less than $1.0 \times 10^{-7}$). In one embodiment, the center region (261C, 262C) of a memory film 26 may include each volume of the memory film 26 having an atomic ratio of the passivation element to oxygen that is less than 0.05, and the peripheral region (261P, 262P) of a memory film 26 may include each volume of the memory film 26 having an atomic ratio of the passivation element to oxygen that is greater than 0.05 or is infinity (i.e., a condition in which oxygen atoms are absent).

In an alternative embodiment, a non-plasma process may be employed to introduce the passivation element into the peripheral region (261P, 262P), and to form the structure of FIG. 7, or any of the peripheral regions in structures to be subsequently described. For example, a low energy angled ion implantation process may be employed to implant fluorine atoms or nitrogen atoms into the peripheral region (261P, 262P) of a memory film 26.

In embodiments in which the memory film 26 comprises a stack of a first dielectric metal oxide layer 261 and a second dielectric metal oxide layer 262, the first dielectric metal oxide layer 261 may comprise a first center region 261C having an atomic ratio of the passivation element to oxygen that is less than 0.05 and a first peripheral region 261P having an atomic ratio of the passivation element to oxygen that is greater than 0.05; and the second dielectric metal oxide layer 262 may comprise a second center region 262C having an atomic ratio of the passivation element to oxygen that is less than 0.05 and a second peripheral region 262P having an atomic ratio of the passivation element to oxygen that is greater than 0.05.

The lateral thickness of the peripheral region (261P, 262P) in each memory film 26 may be in a range from 1 nm to 5 nm, such as from 2 nm to 4 nm, although lesser and greater lateral thicknesses may also be used. In one embodiment, each peripheral region (261P, 262P) of a memory film 26 may have a passivation element concentration gradient such that an atomic concentration of the passivation element (which may be fluorine atoms or nitrogen atoms) decreases with a distance from a surface (i.e., a sidewall) of the memory film 26.

According to an aspect of the present disclosure, presence of the peripheral region (261P, 262P) in which oxygen atoms are absent or are partially replaced with fluorine atoms or nitrogen atoms suppresses formation of conductive filaments within the peripheral region (261P, 262P) in each memory cell 20. In some embodiments, an outer segment of each peripheral region (261P, 262P) may be free of oxygen atoms. As used herein, a physical volume is "free of an element" if the atomic percentage of the element is less than $1.0 \times 10^{-6}$ percent (i.e., less than $1.0 \times 10^{-8}$ in atomic fraction) or is below the detection limit of analytical instruments available in the art for the purpose of ascertaining material composition within the physical volume. The lateral thickness of such an oxygen-free surface segment may be in a range from 1 nm to 4 nm, although lesser and greater thicknesses may also be used. The absence or reduction of oxygen atoms in the peripheral region (261P, 262P) increases the endurance of the memory cell 20, and reduces the cell leakage current due to absence of oxygen deficiency filaments therein.

Figure 8:
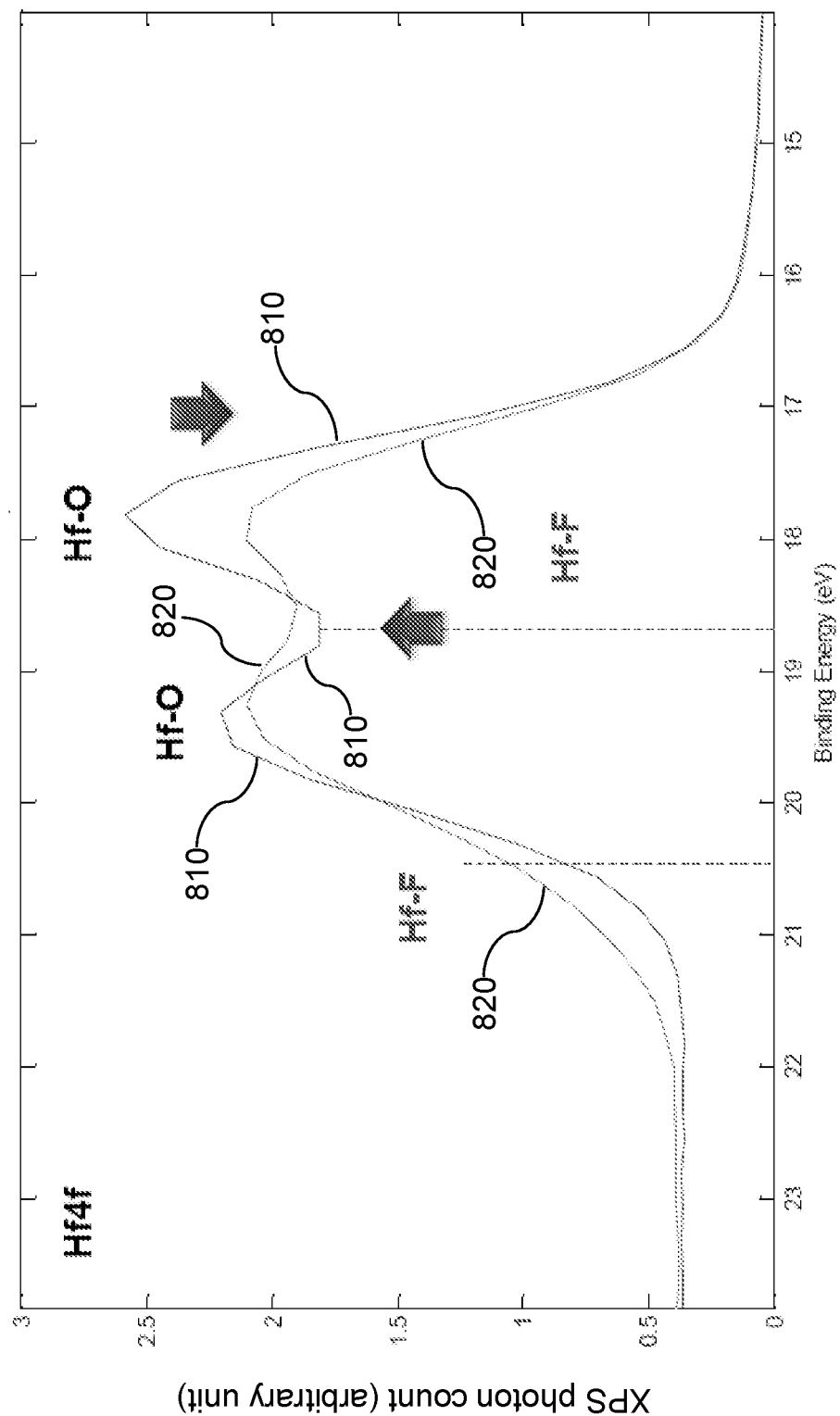
FIG. 8 illustrates exemplary x-ray photoemission spectroscopy data from an untreated hafnium oxide surface and from a hafnium oxide surface treated with a passivation element-containing plasma.

Referring to FIG. 8, exemplary x-ray photoemission spectroscopy (XPS) data from an untreated hafnium oxide surface and from a hafnium oxide surface treated with a fluorine plasma. A first curve 810 shows the XPS data from the untreated hafnium oxide surface. A second curve 820 shows the XPS data from hafnium oxide surface treated with the fluorine plasma. In this embodiment, the normalized metal-fluorine bond (for example, Hf—F) intensity may range from about 1 to about 10. The XPS data show that a peripheral region (261P, 262P) may be passivated by the fluorine plasma to replace a significant fraction, and/or a predominant fraction, of metal-oxygen bonds with metal-fluorine bonds. While the XPS data illustrates the embodiment of fluorine plasma treatment on a hafnium oxide surface, it is believed that the same phenomenon would occur with nitrogen plasma and/or other oxygen deficiency filament-forming dielectric metal oxide materials discussed above.

Figure 9A:
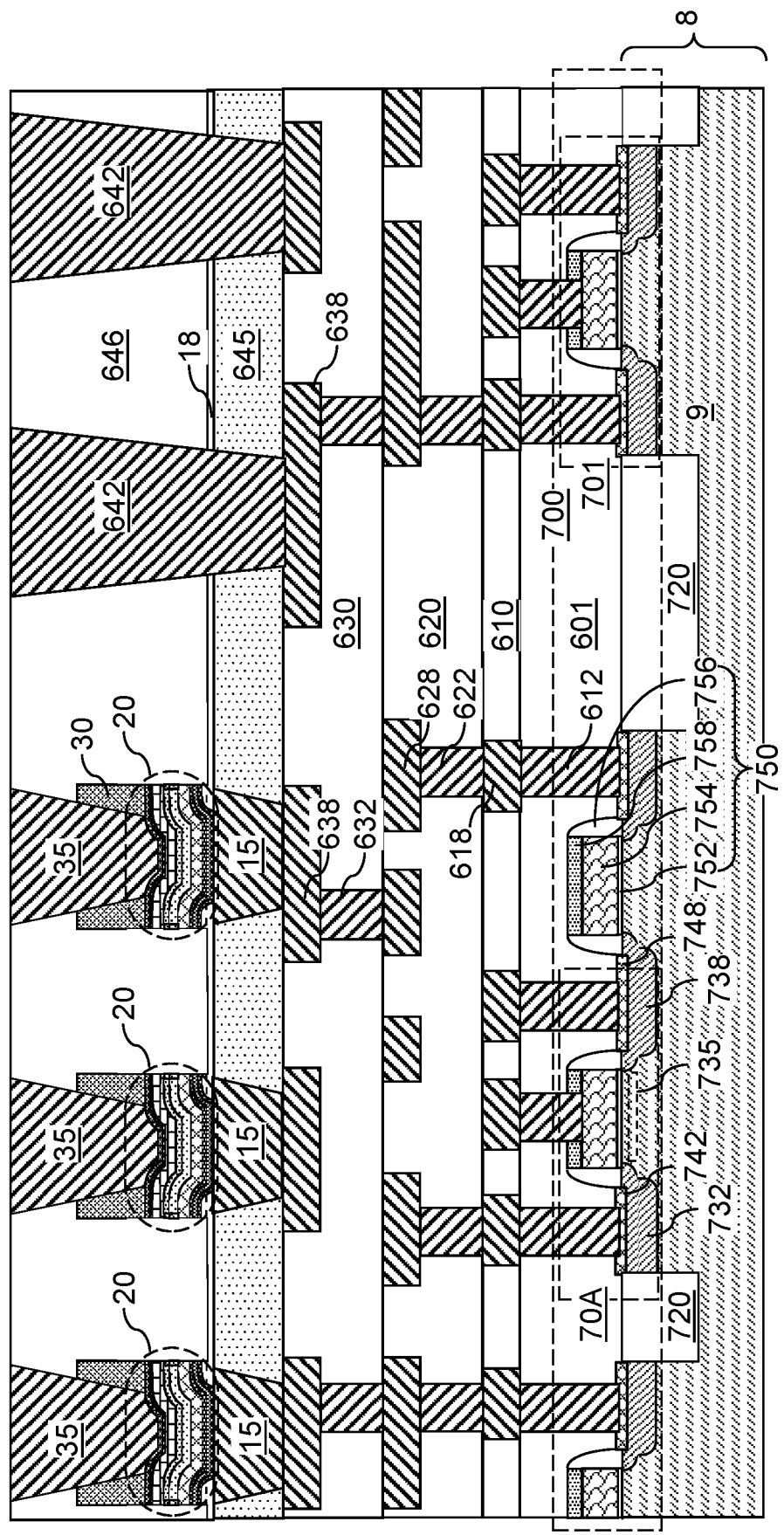
FIG. 9A is a vertical cross-sectional view of the first exemplary structure after formation of an upper via-level dielectric material layer and connection via structures according to an embodiment of the present disclosure.
Figure 9B:
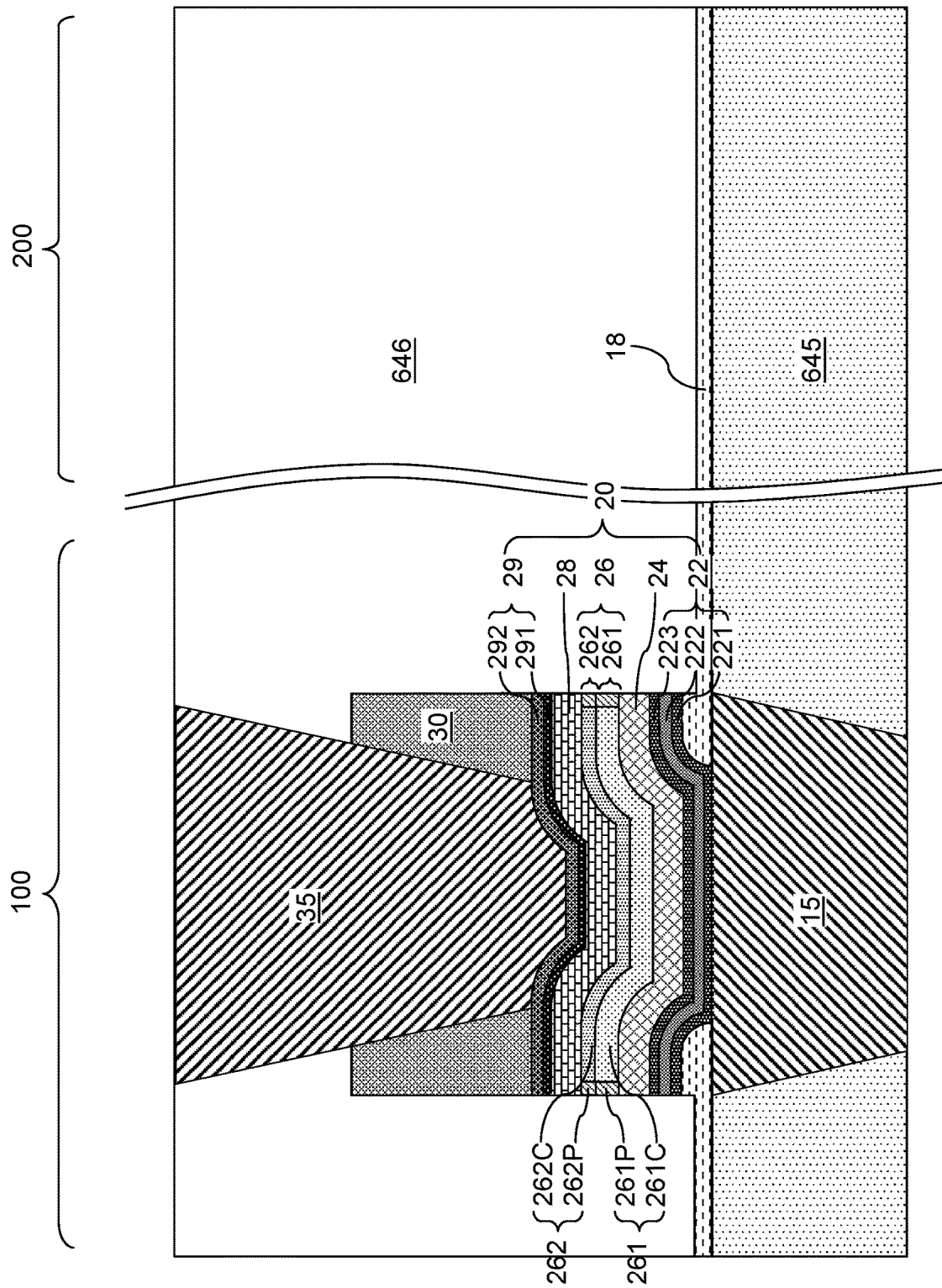
FIG. 9B is a magnified view a region of the first exemplary structure at the processing steps of FIG. 9A.

Referring to FIGS. 9A and 9B, an upper via-level dielectric material layer 646 may be formed over the two-dimensional array of memory cells 20 and the hard mask caps 30. The upper via-level dielectric material layer 646 may comprise any dielectric material that may be used for the lower via-level dielectric material layer 645. In one embodiment, the upper via-level dielectric material layer 646 may comprise a planarizable dielectric material such as silicon oxide, or may comprise a self-planarizing dielectric material such as a spin-on dielectric material. In this embodiment, the top surface of the upper via-level dielectric material layer 646 may be formed as a planar or a semi-planar surface. The thickness of the upper via-level dielectric material layer 646 may be selected such that the top surface of the upper via-level dielectric material layer 646 is formed above the horizontal plane including the top surfaces of the hard mask caps 30.

Via cavities may be formed above the two-dimensional array of memory cells 20 and over the metal interconnect structures (such as the third metal line structures 638) in the peripheral region 200. Top surfaces of the top metallic barrier plates 29 (or the top electrodes 28) may be physically exposed at the bottom of the via cavities formed in the memory array region 100, and top surface of underlying metal interconnect structures (such as the third metal line structures 638) may be physically exposed at the bottom of the via cavities formed in the peripheral region 200. At least one metallic material (such as a combination of a metallic barrier liner and a metallic fill material) may be deposited within each of the via cavities, and excess portions of the at least one metallic material may be removed from above the top surface of the upper via-level dielectric material layer 646 by a planarization process. The planarization process may comprise a chemical mechanical polishing (CMP) process or a recess etch process. Each remaining portion of the at least one metallic material filling a via cavity that overlies a memory cell 20 constitutes a top connection via structure 35. Each remaining portion of the at least one metallic material filling a via cavity in the peripheral region 200 constitutes a third metal via structure 642. Each top connection via structure 35 contacts a top metallic barrier plates 29 and/or a top electrode 28.

Figure 10A:
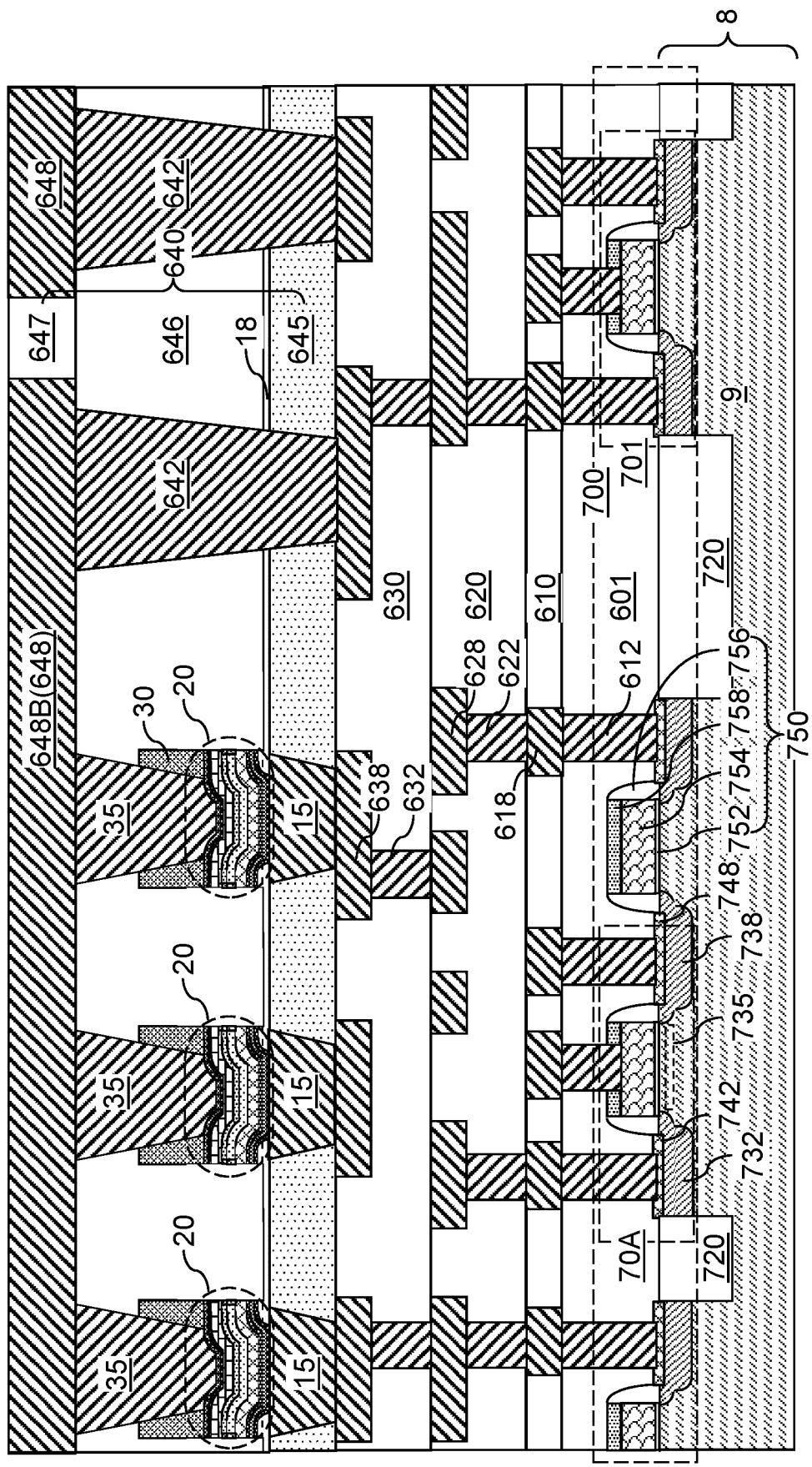
FIG. 10A is a vertical cross-sectional view of the first exemplary structure after formation of bit lines according to an embodiment of the present disclosure.
Figure 10B:
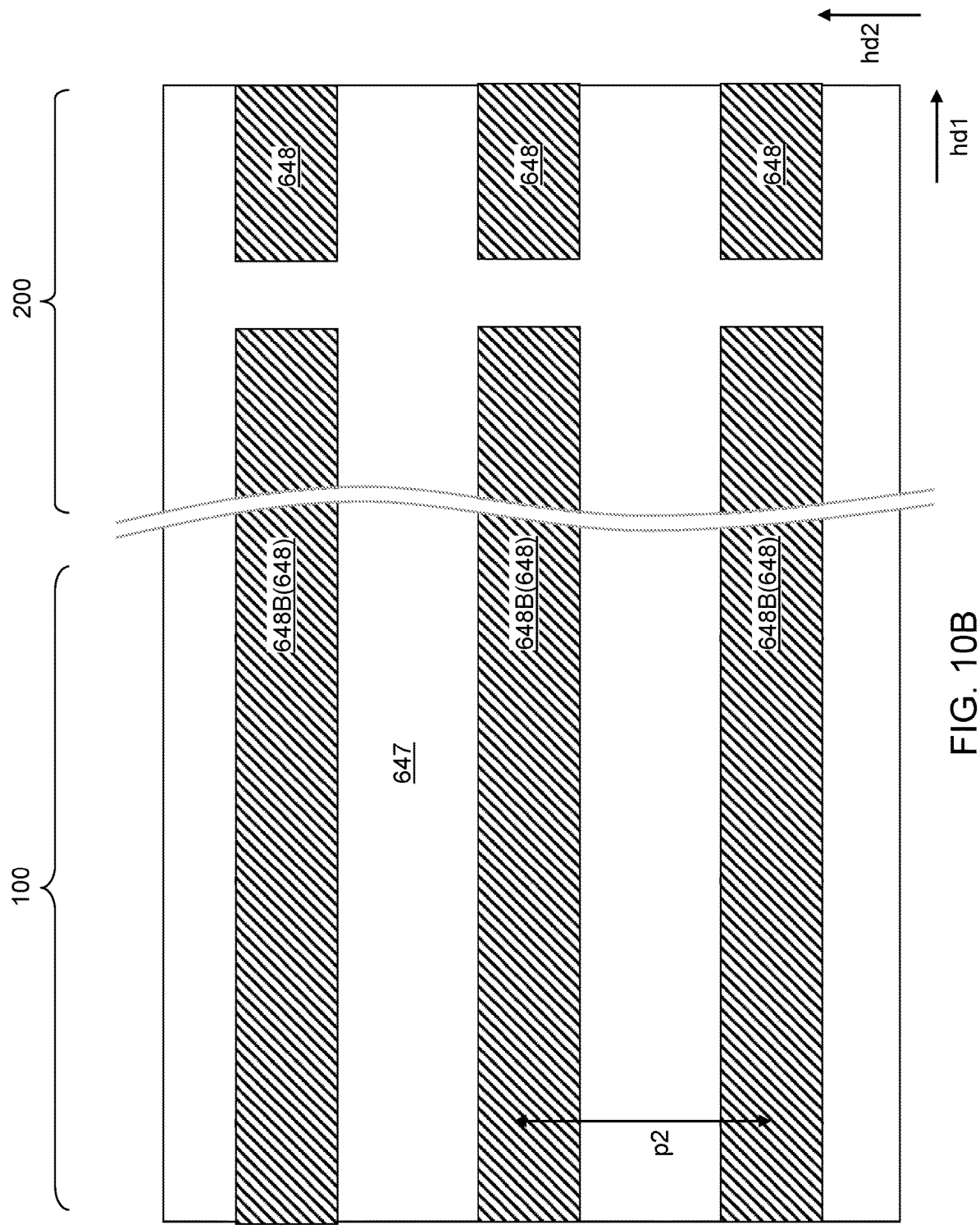
FIG. 10B is a top-down view of the first exemplary structure of FIG. 10A.

Referring to FIGS. 10A and 10B, a line-level dielectric material layer 647 may be deposited over the upper via-level dielectric layer 646. The combination of the lower via-level dielectric material layer 645, the etch-stop dielectric material layer 18, the upper via-level dielectric material layer 646, and the line-level dielectric material layer 647 constitutes an interconnect-level dielectric material layer such as a fourth interconnect-level dielectric material layer 640.

Line cavities may be formed in the line-level dielectric material layer 647, and may be filled with at least one metallic material (such as a combination of a metallic barrier liner and a metallic fill material) to form metal line structures, which are herein referred to as fourth metal line structures 648. In one embodiment, a subset of the fourth metal line structures 648 may comprise bit lines 648B that laterally extend along the first horizontal direction hd1. Each of the bit lines 648B may contact a respective row of top connection via structures 35 arranged along the first horizontal direction hd1. In one embodiment, the bit lines 648B may be periodic along the second horizontal direction hd2 with a periodicity of the second pitch p2.

The first exemplary structure comprises a semiconductor structure. The semiconductor structure includes a two-dimensional array of memory cells 20 comprising a respective first electrode 24, a respective memory film 26, and a respective second electrode 28 that overlies a substrate 8. Each memory film 26 within the two-dimensional array of stacks comprises a respective center region (261C, 262C) in which a first average atomic ratio of the passivation element to oxygen is less than 0.01 (and/or less than 0.001, and/or less than 0.0001, and/or less than $1.0 \times 10^{-5}$, and/or less than $1.0 \times 10^{-6}$, and/or less than $1.0 \times 10^{-7}$), and comprises a respective peripheral region (261P, 262P) in which a second average atomic ratio of the passivation element to oxygen is greater than 0.05 (and/or greater than 0.10, and/or greater than 0.10, and/or greater than 0.5, and/or greater than 1.0, and/or greater than 2, and/or greater than 5, and/or greater than 10).

The semiconductor structure further includes a two-dimensional array of access transistors 70A located on the substrate 8, wherein each access transistor 70A within the two-dimensional array of access transistors 70A is electrically connected to a respective memory cell 20 within the two-dimensional array of memory cells 20; and metal interconnect structures (612, 618, 622, 628, 632, 638, 15) located within dielectric material layers (601, 610, 620, 630, 645, 18) and providing electrical connection between the two-dimensional array of access transistors 70A and the two-dimensional array of memory cells 20.

In one embodiment, the metal interconnect structures (612, 618, 622, 628, 632, 638, 15) comprises a two-dimensional array of via structures (such as bottom connection via structures 15); and the dielectric material layers (601, 610, 620, 630, 645, 18) comprise an etch-stop dielectric material layer 18 contacting top surfaces of the via structures 15 within the two-dimensional array of via structures 15, and comprising a horizontally-extending portion and a two-dimensional array of vertically protruding portions.

In one embodiment, each of the vertically-protruding portions comprises a respective sidewall that is vertically coincident with a sidewall of a respective one of the first electrodes 24 and has a respective bottom periphery P that is adjoined to a respective periphery of the horizontally-extending portion; the etch-stop dielectric material layer 18 comprises a two-dimensional array of openings therethrough; and each opening through the etch-stop dielectric material layer 18 is located entirely within an area of a respective one of the first electrodes 24 in a plan view.

Figure 11:
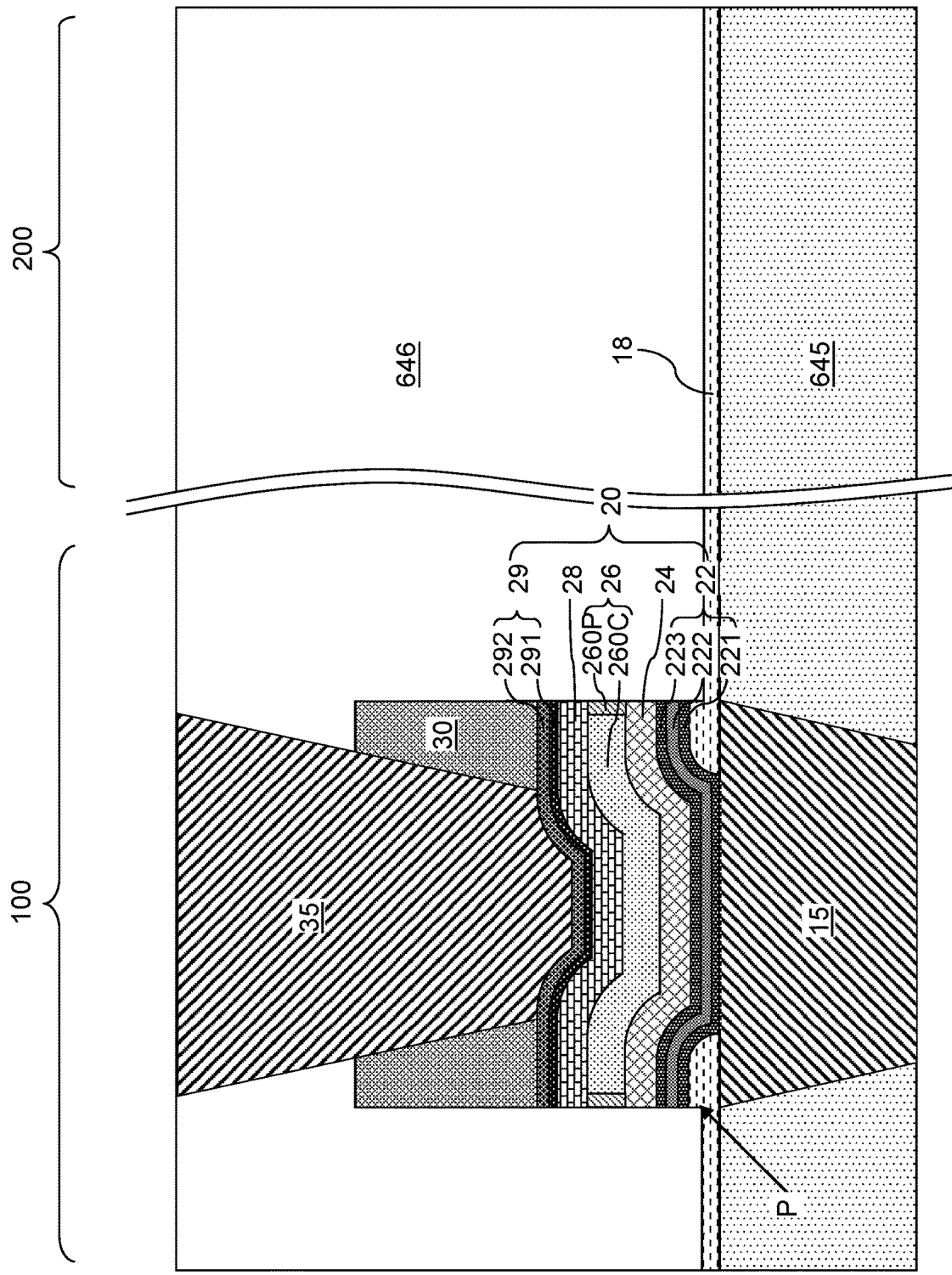
FIG. 11 is a vertical cross-sectional view of a region including a memory cell of an alternative configuration of the first exemplary structure according to an embodiment of the present disclosure.

Referring to FIG. 11, an alternative configuration of the first exemplary structure may be derived from the first exemplary structure by using a single dielectric metal oxide layer as a memory material layer 26L at the processing steps of FIG. 4. In this embodiment, each memory film 26 may consist of a single dielectric metal oxide layer. Each memory film 26 comprises a center region 260C and a peripheral region 260P. The center region 260C and the peripheral region 260P may have the compositions of a first center region 261C and a first peripheral region 261P as described above, respectively, or may have the compositions of a second center region 262C and a second peripheral region 262P as described above, respectively. In this embodiment, the center region of each memory film 26 may have a same material composition along a vertical direction between a first interface with the first electrode 24 and a second interface with the second electrode 28 (i.e., along the vertical direction).

Figure 12:
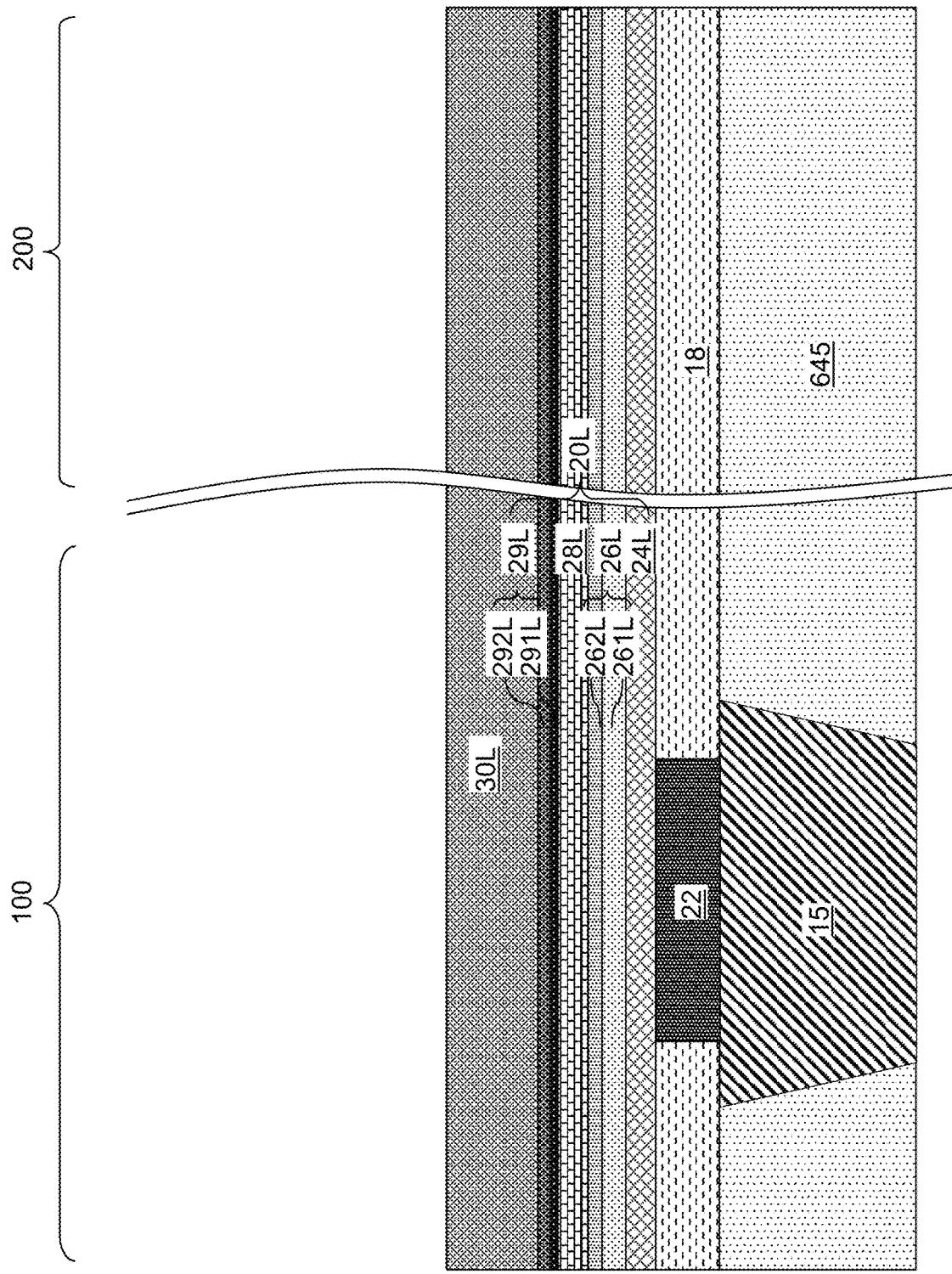
FIG. 12 is a vertical cross-sectional view of a region of a second exemplary structure after formation of an etch-stop dielectric material layer, a bottom metallic barrier via structure, a bottom electrode layer, at least one dielectric metal oxide layer, a top electrode layer, at least one top metallic barrier layer, and a hard mask layer according to an embodiment of the present disclosure.

Referring to FIG. 12, a second exemplary structure according to an embodiment of the present disclosure may be derived from the first exemplary structure of FIG. 3 by forming a two-dimensional array of openings through the etch-stop dielectric material layer 18, by removing the photoresist layer 19, by forming a two-dimensional array of bottom metallic barrier plates 22, and by forming a layer stack including, from bottom to top, a first electrode layer 24L, a memory material layer 26L, a second electrode layer 28L, at least one optional top metallic barrier layer 29L, and a hard mask layer 30L.

In one embodiment, the two-dimensional array of bottom metallic barrier plates 22 may be formed by depositing at least one metallic barrier material in the openings through the etch-stop dielectric material layer 18, and by removing portions of the at least one metallic barrier material from above the horizontal plane including the top surface of the etch-stop dielectric material layer 18 by a planarization process such as a chemical mechanical polishing process. The at least one metallic barrier material of the bottom metallic barrier plates 22 may comprise any of the metallic barrier materials that may be used for any of the first bottom metallic barrier layer 221L, the second bottom metallic barrier layer 222L, and the third bottom metallic barrier layer 223L as described with reference to FIG. 5. Each of the first electrode layer 24L, the memory material layer 26L, the second electrode layer 28L, the at least one optional top metallic barrier layer 29L, and the hard mask layer 30L may have the same material composition and the same thickness range as in the first exemplary structure.

Figure 13:
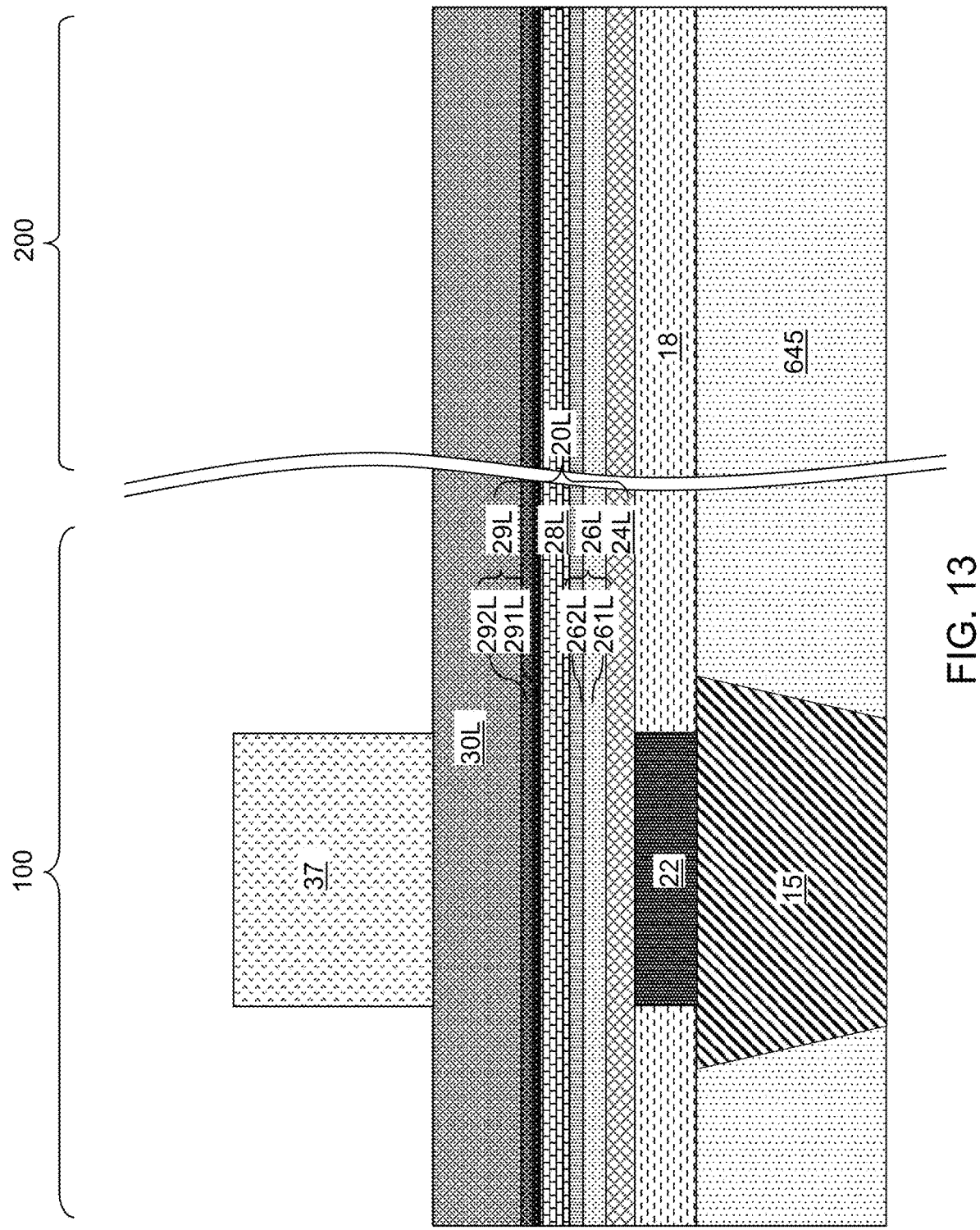
FIG. 13 is a vertical cross-sectional view of a region of the second exemplary structure after formation of a patterned photoresist layer according to an embodiment of the present disclosure.

Referring to FIG. 13, a photoresist layer may be applied over the hard mask layer 30L and may be lithographically patterned to form a patterned photoresist layer 37. The patterned photoresist layer 37 may comprise a two-dimensional periodic array of discrete photoresist material portions that overlie a respective one of the bottom connection via structures 15. As such, the two-dimensional periodic array of discrete photoresist material portions may have the same two-dimensional periodicity as the two-dimensional array of bottom connection via structures 15. Each of the discrete photoresist material portions may have an areal overlap with a respective underlying opening in the etch-stop dielectric material layer 18. In one embodiment, each of the discrete photoresist material portion may have a periphery that is laterally offset outward with respect to a periphery of an underlying opening in the etch-stop dielectric material layer 18 in a plan view (i.e., a top-down view).

Figure 14:
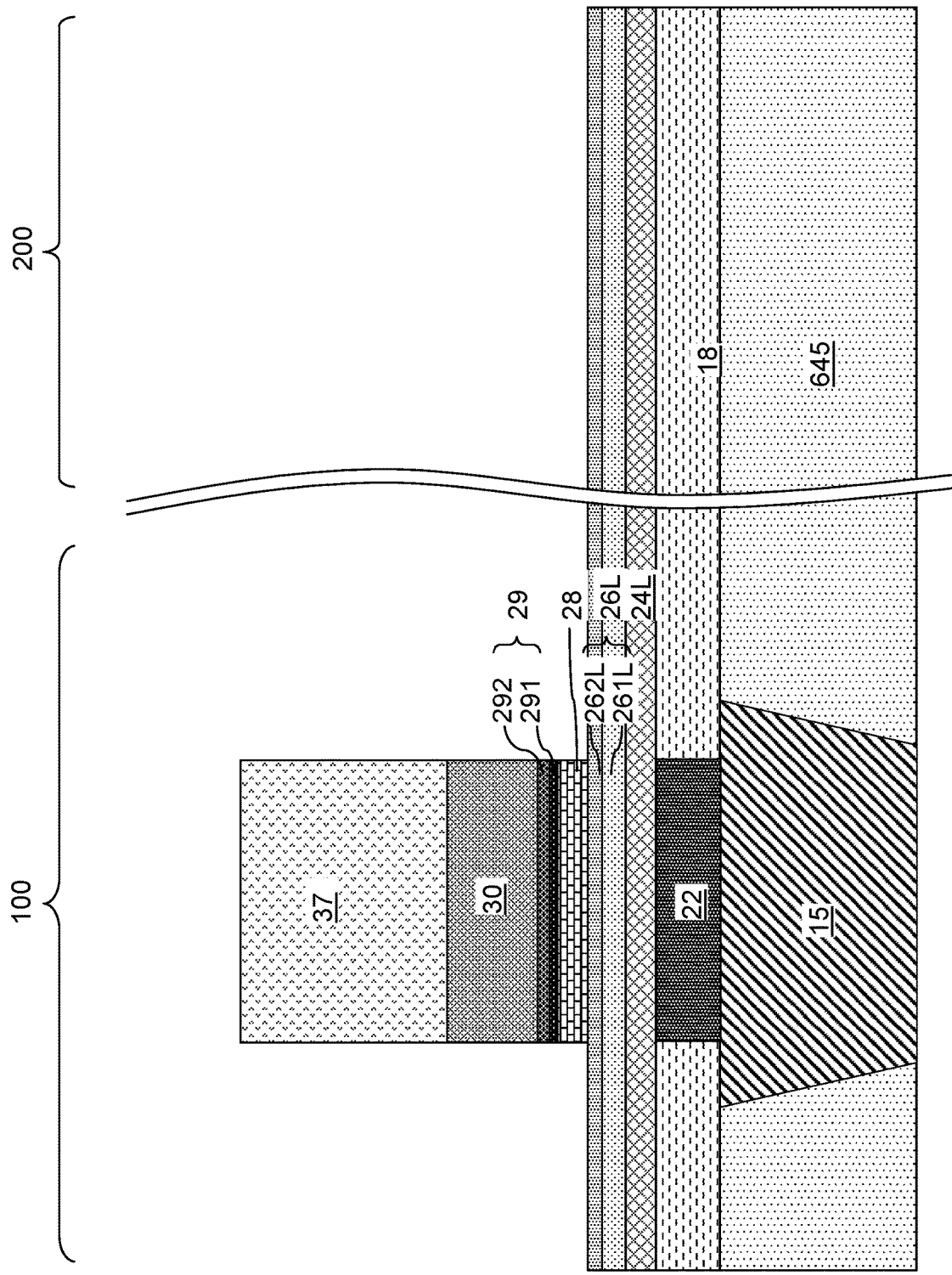
FIG. 14 is a vertical cross-sectional view of a region of the second exemplary structure after formation of hard mask structures and top electrodes according to an embodiment of the present disclosure.

Referring to FIG. 14, the pattern of the two-dimensional array of discrete photoresist material portions of the patterned photoresist layer 37 may be transferred through the hard mask layer 30L, the at least one optional top metallic barrier layer 29L, and the second electrode layer 28L by performing a first anisotropic etch process. The hard mask layer 30L may be patterned into a two-dimensional array of hard mask caps 30. The at least one optional top metallic barrier layer 29L (if used) may be patterned into a two-dimensional array of top metallic barrier plates 29. In one embodiment, each top metallic barrier plate 29 may comprise a stack of a first top metallic barrier plate 291 (which is a patterned portion of the first top metallic barrier layer 291L), and a second top metallic barrier plate 292 (which is a patterned portion of the second top metallic barrier layer 292L). The second electrode layer 28L may be patterned into a two-dimensional array of second electrodes 28. The memory material layer 26L may be used as an etch stop layer for the first anisotropic etch process. The patterned photoresist layer 37 may be subsequently removed, for example, by ashing.

Figure 15:
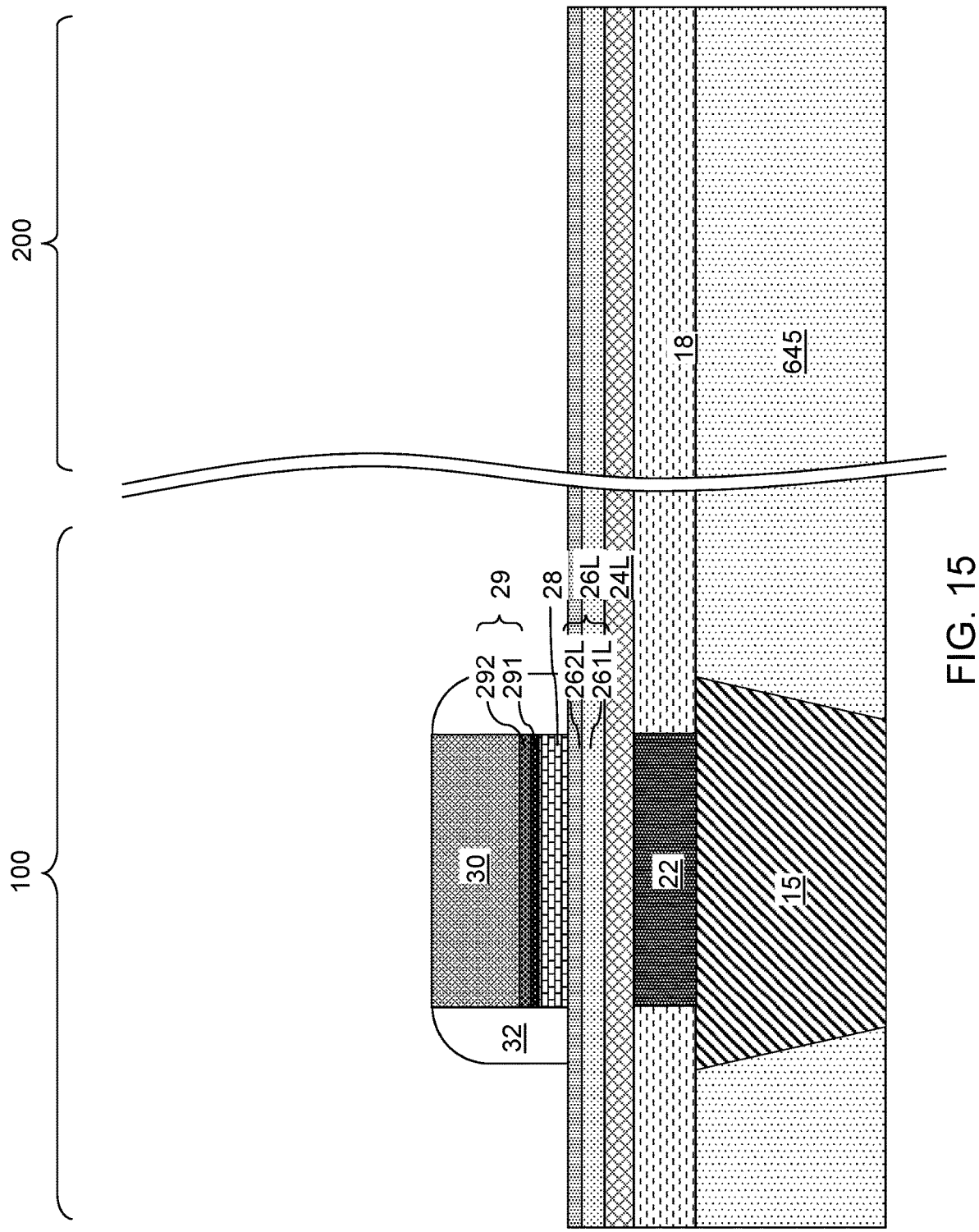
FIG. 15 is a vertical cross-sectional view of a region of the second exemplary structure after formation of dielectric spacers according to an embodiment of the present disclosure.

Referring to FIG. 15, an insulating material such as silicon nitride, silicon nitride carbide, or silicon oxide may be conformally deposited over the two-dimensional array of second electrodes 28 by a conformal deposition process (such as a chemical vapor deposition process) to form an insulating material layer. An anisotropic etch process may be performed to remove horizontally-extending portions of the insulating material layer. Each remaining cylindrical portion of the insulating material layer that laterally surrounds a respective stack of a second electrode 28, a top metallic barrier plate 29, and a hard mask cap 30 constitutes an insulating spacer 32. The lateral thickness of each insulating spacer 32, as measured between an inner sidewall and an outer sidewall, may be in a range from 4 nm to 80 nm, such as from 8 nm to 40 nm, although lesser and greater lateral thicknesses may also be used. Each insulating spacer 32 laterally surrounding a respective second electrode 28.

Figure 16:
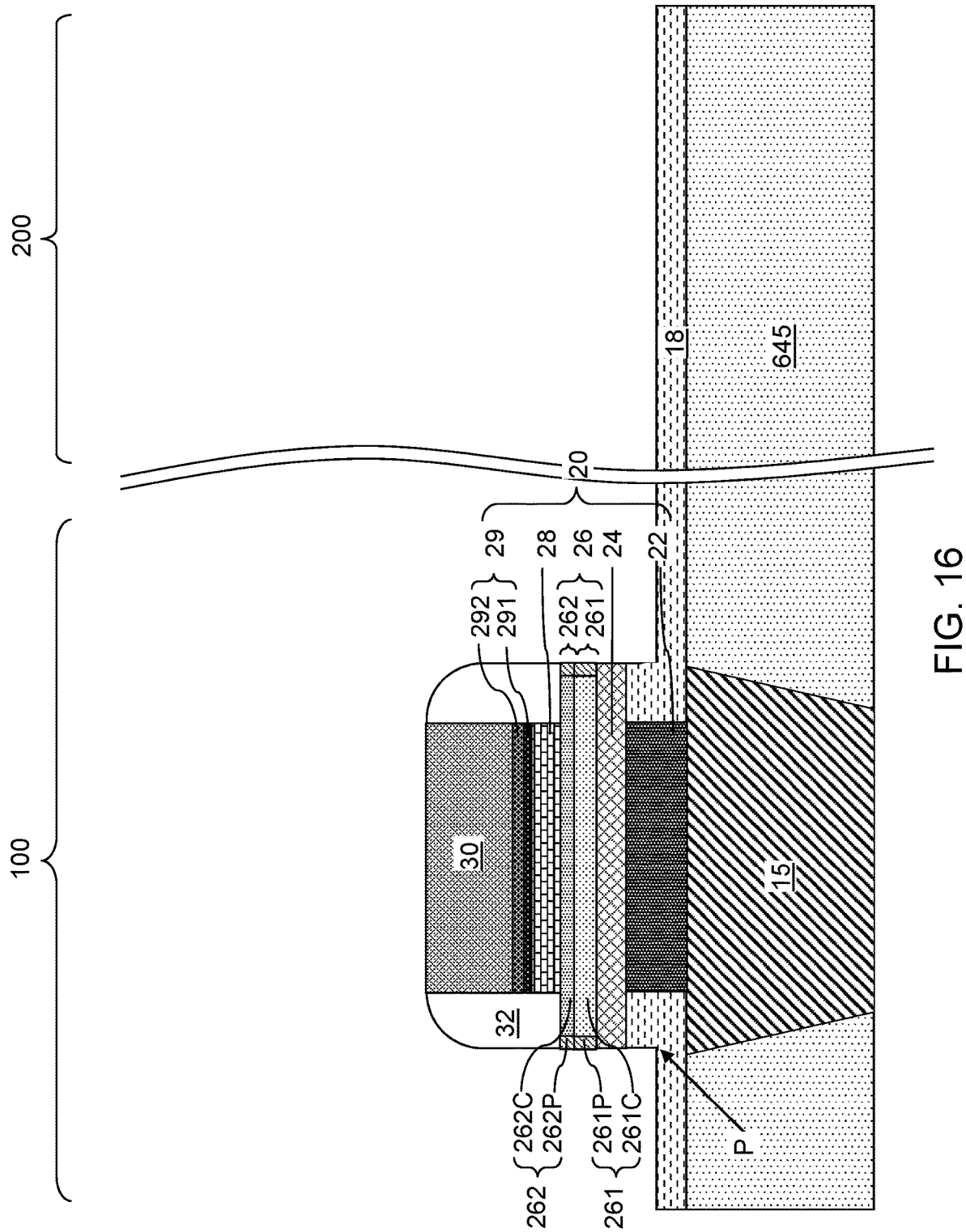
FIG. 16 is a vertical cross-sectional view of a region of the second exemplary structure after formation of memory films and bottom electrodes according to an embodiment of the present disclosure.

Referring to FIG. 16, a second anisotropic etch process may be performed to transfer the pattern in the combination of the two-dimensional array of hard mask caps 30 and the two-dimensional array of the insulating spacers 32 through the memory material layer 26L and the first electrode layer 24L. Each patterned portion of the memory material layer 26L comprises a memory film 26. Each patterned portion of the first electrode layer 24L comprises a first electrode 24.

Each memory film 26 includes at least one dielectric metal oxide layer including an oxygen-deficient filament-forming dielectric metal oxide material. For example, the memory film 26 may comprise a layer stack including a first dielectric metal oxide layer 261 and a second dielectric metal oxide layer 262.

Generally, portions of the second electrode layer 28L, the memory material layer 26L, and the first electrode layer 24L that are not masked by the two-dimensional array of second electrodes 28 and the two-dimensional array of insulating spacers 32 may be anisotropically etched during the second anisotropic etch process. Remaining portions of the memory material layer 26L and the first electrode layer 24L comprise memory films 26 and first electrodes 24.

Each contiguous set of a bottom metallic barrier plate 22, a first electrode 24, a memory film 26, a top electrode 28, and a top metallic barrier plate 29 constitutes a memory cell 20. A two-dimensional periodic array of memory cells 20 may be formed. The two-dimensional periodic array of memory cells 20 may have the first pitch p1 along the first horizontal direction hd1, and the second pitch p2 along the second horizontal direction hd2. In one embodiment, each first interface between a memory film 26 and a first electrode 24 may comprise a horizontal segment. Each second interface between a memory film 26 and a second electrode 28 may comprise a horizontal segment.

In one embodiment, a sidewall or sidewalls of a first electrode 24, a sidewall or sidewalls of a memory film 26, and an outer sidewall of an overlying insulating spacer 32 may be vertically coincident with one another. In an illustrative embodiment in which a memory cell 20 has a horizontal cross-sectional shape of a circle, the vertical plane may be a cylindrical vertical plane.

In one embodiment, the second anisotropic etch process may have an etch chemistry that is selective to the material of the etch-stop dielectric material layer 18. However, a collateral etching of a top portion of the etch-stop dielectric material layer 18 may occur at a terminal portion of the second anisotropic etch process. In one embodiment, the etch-stop dielectric material layer 18 underlies each of the first electrodes 24, and comprises a horizontally-extending portion and a two-dimensional array of vertically protruding portions. Each of the vertically-protruding portions comprises a sidewall that is vertically coincident with a sidewall of a first electrode 24 and has a bottom periphery P that is adjoined to a periphery of the horizontally-extending portion. The etch-stop dielectric material layer 18 comprises an opening therethrough within an area of each of the first electrodes 24 in a plan view.

As discussed above, physically exposed surface of the memory films 26 may contain structural and/or compositional defects that are introduced during the second anisotropic etch process. Some of such defects provide conditions that are conductive to premature formation of oxygen deficiency filaments, for example, under an electrical field having a magnitude that is less than a threshold field magnitude, and are adverse to removal of oxygen deficiency filaments (and thus, does not fully remove the oxygen deficiency filaments even if an electrical field that should be sufficient to erase oxygen deficiency filaments for defect-free dielectric metal oxides is applied). Further, such defects function as leakage paths for the memory cells 20 under normal operating conditions.

A passivation plasma treatment process may be performed to passivate the surface regions of the memory films 26. Defects that are induced during the second anisotropic etch process are passivated by replacement of oxygen atoms with passivation elements that are provided during the passivation plasma treatment process. The passivation plasma treatment process uses a fluorine gas plasm or a nitrogen gas plasma. The process conditions for the gas plasma treatment process may be the same as the process conditions of the gas plasma treatment process described with reference to FIG. 7.

Generally, the material of the memory films 26 and the species of the gas in the gas plasma may be selected such that the atomic bonding strength between the metal element(s) in the memory films 26 and fluorine atoms or oxygen atoms provided from the gas plasma is greater than the atomic bonding strength between the metal elements and oxygen atoms. Thus, upon replacement of the oxygen atoms with fluorine atoms or nitrogen atoms in the surface portions of the memory films 26 during the passivation plasma treatment process, the fluorine atoms or the nitrogen atoms in the surface portions of the memory films 26 are not replaced with oxygen atoms even if the memory films 26 are exposed to the atmospheric ambient that includes oxygen after the passivation plasma treatment process.

Each memory film 26 includes a center region (261C, 262C) in which the material composition is not substantially affected by the passivation plasma treatment, and a peripheral region (261P, 262P) in which the passivation plasma treatment process replaced oxygen atoms with fluorine atoms or nitrogen atoms at a substantial fraction. The average atomic ratio of a passivation element (which may be fluorine or nitrogen) to oxygen in the peripheral region (261P, 262P) increases from a first number that is less than 0.01 (and/or less than 0.001, and/or less than 0.0001, and/or less than $1.0 \times 10^{-5}$, and/or less than $1.0 \times 10^{-6}$, and/or less than $1.0 \times 10^{-7}$) to a second number greater than 0.05 (and/or greater than 0.10, and/or greater than 0.10, and/or greater than 0.5, and/or greater than 1.0, and/or greater than 2, and/or greater than 5, and/or greater than 10). In one embodiment, the average atomic ratio of the passivation element (i.e., fluorine atoms or nitrogen atoms) to oxygen in each peripheral region (261P, 262P) of each memory film 26 may be greater than 0.05, and/or greater than 0.10, and/or greater than 0.5, and/or greater than 1.0, and/or greater than 2, and/or greater than 5, and/or greater than 10. In one embodiment, the center region (261C, 262C) of each memory film 26 may have an average atomic ratio of the passivation element to oxygen that is less than 0.01 (and/or less than 0.001, and/or less than 0.0001, and/or less than $1.0 \times 10^{-5}$, and/or less than $1.0 \times 10^{-6}$, and/or less than $1.0 \times 10^{-7}$). In one embodiment, the center region (261C, 262C) of a memory film 26 may include each volume of the memory film 26 having an atomic ratio of the passivation element to oxygen that is less than 0.05, and the peripheral region (261P, 262P) of a memory film 26 may include each volume of the memory film 26 having an atomic ratio of the passivation element to oxygen that is greater than 0.05 or is infinity (i.e., a condition in which oxygen atoms are absent).

In embodiments in which the memory film 26 comprises a stack of a first dielectric metal oxide layer 261 and a second dielectric metal oxide layer 262, the first dielectric metal oxide layer 261 may comprise a first center region 261C having an atomic ratio of the passivation element to oxygen that is less than 0.05 and a first peripheral region 261P having an atomic ratio of the passivation element to oxygen that is greater than 0.05; and the second dielectric metal oxide layer 262 may comprise a second center region 262C having an atomic ratio of the passivation element to oxygen that is less than 0.05 and a second peripheral region 262P having an atomic ratio of the passivation element to oxygen that is greater than 0.05.

The lateral thickness of the peripheral region (261P, 262P) in each memory film 26 may be in a range from 1 nm to 5 nm, such as from 2 nm to 4 nm, although lesser and greater lateral thicknesses may also be used. In one embodiment, each peripheral region (261P, 262P) of a memory film 26 may have a passivation element concentration gradient such that an atomic concentration of the passivation element (which may be fluorine atoms or nitrogen atoms) decreases with a distance from a surface (i.e., a sidewall) of the memory film 26.

According to an aspect of the present disclosure, presence of the peripheral region (261P, 262P) in which oxygen atoms are absent or are partially replaced with fluorine atoms or nitrogen atoms suppresses formation of conductive filaments within the peripheral region (261P, 262P) in each memory cell 20. In some embodiments, an outer segment of each peripheral region (261P, 262P) may be free of oxygen atoms. The lateral thickness of such an oxygen-free surface segment may be in a range from 1 nm to 4 nm, although lesser and greater thicknesses may also be used. The absence or reduction of oxygen atoms in the peripheral region (261P, 262P) increases the endurance of the memory cell 20, and reduces the cell leakage current due to absence of oxygen deficiency filaments therein.

Figure 17A:
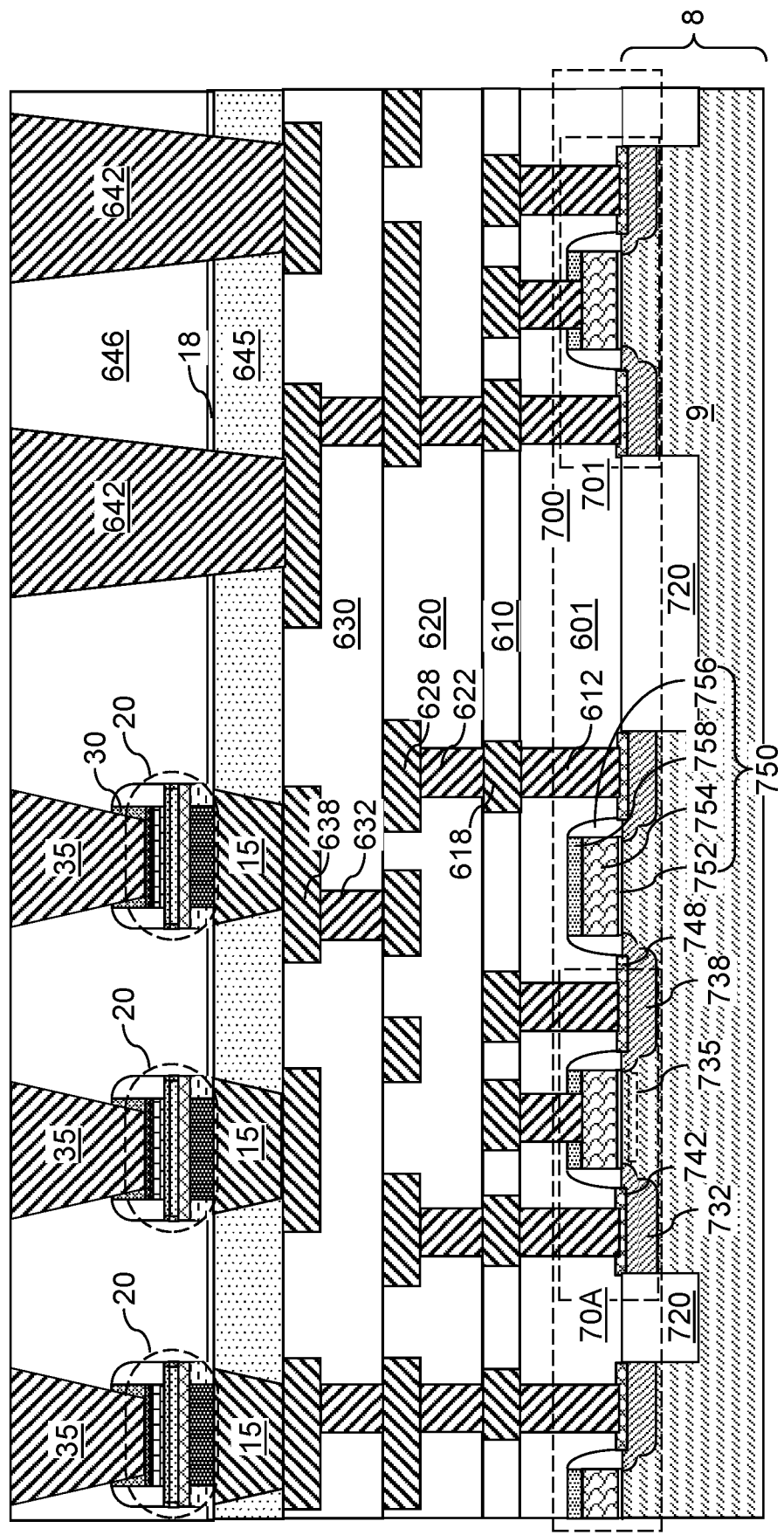
FIG. 17A is a vertical cross-sectional view of the second exemplary structure after formation of an upper via-level dielectric material layer and connection via structures according to an embodiment of the present disclosure.
Figure 17B:
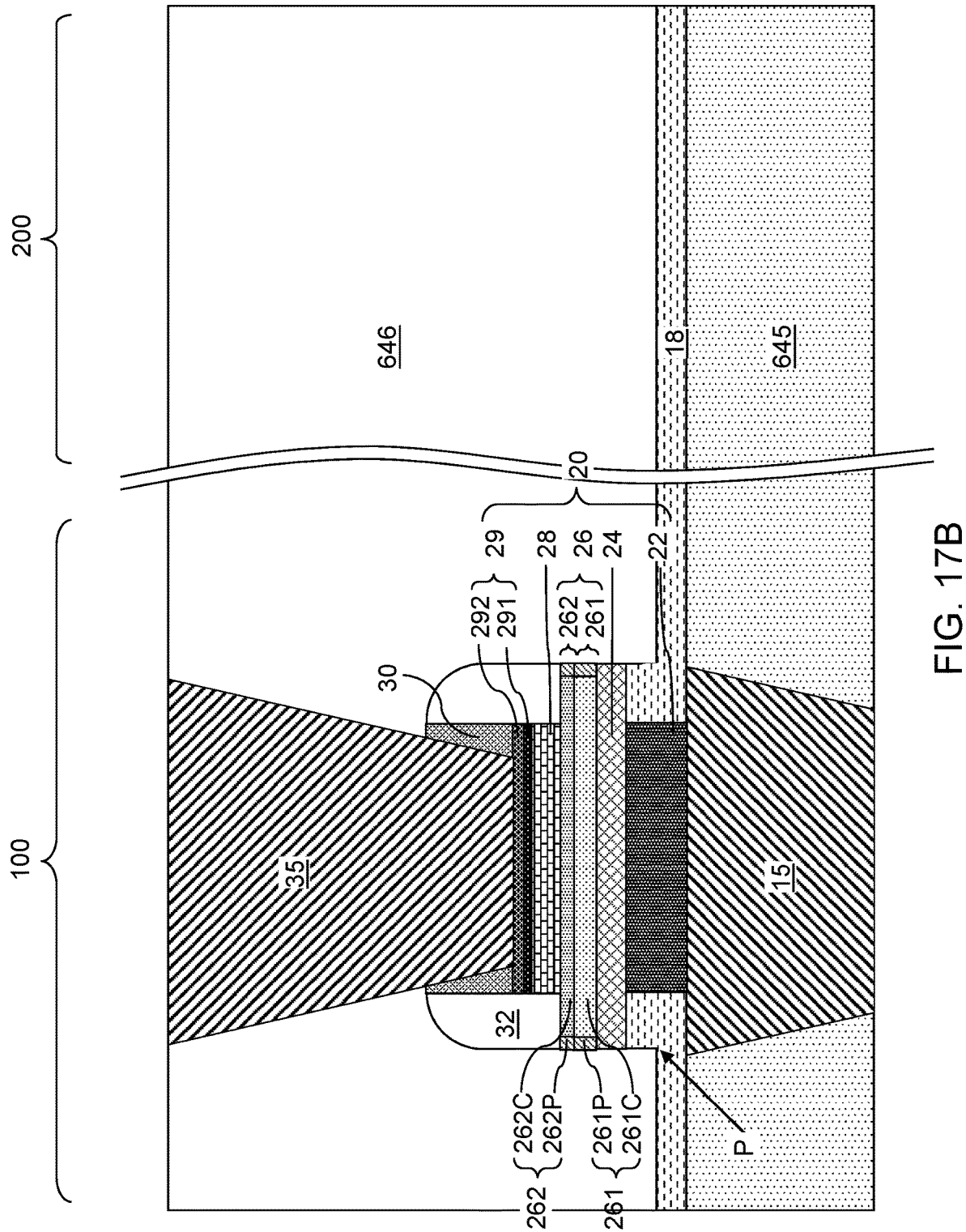
FIG. 17B is a magnified view a region of the second exemplary structure at the processing steps of FIG. 17A.

Referring to FIGS. 17A and 17B, the processing steps described with reference to FIGS. 9A and 9B may be performed to form an upper via-level dielectric material layer 646, top connection via structure 35, and third metal via structure 642. Each top connection via structure 35 contacts a top metallic barrier plates 29 and/or a top electrode 28.

Figure 18A:
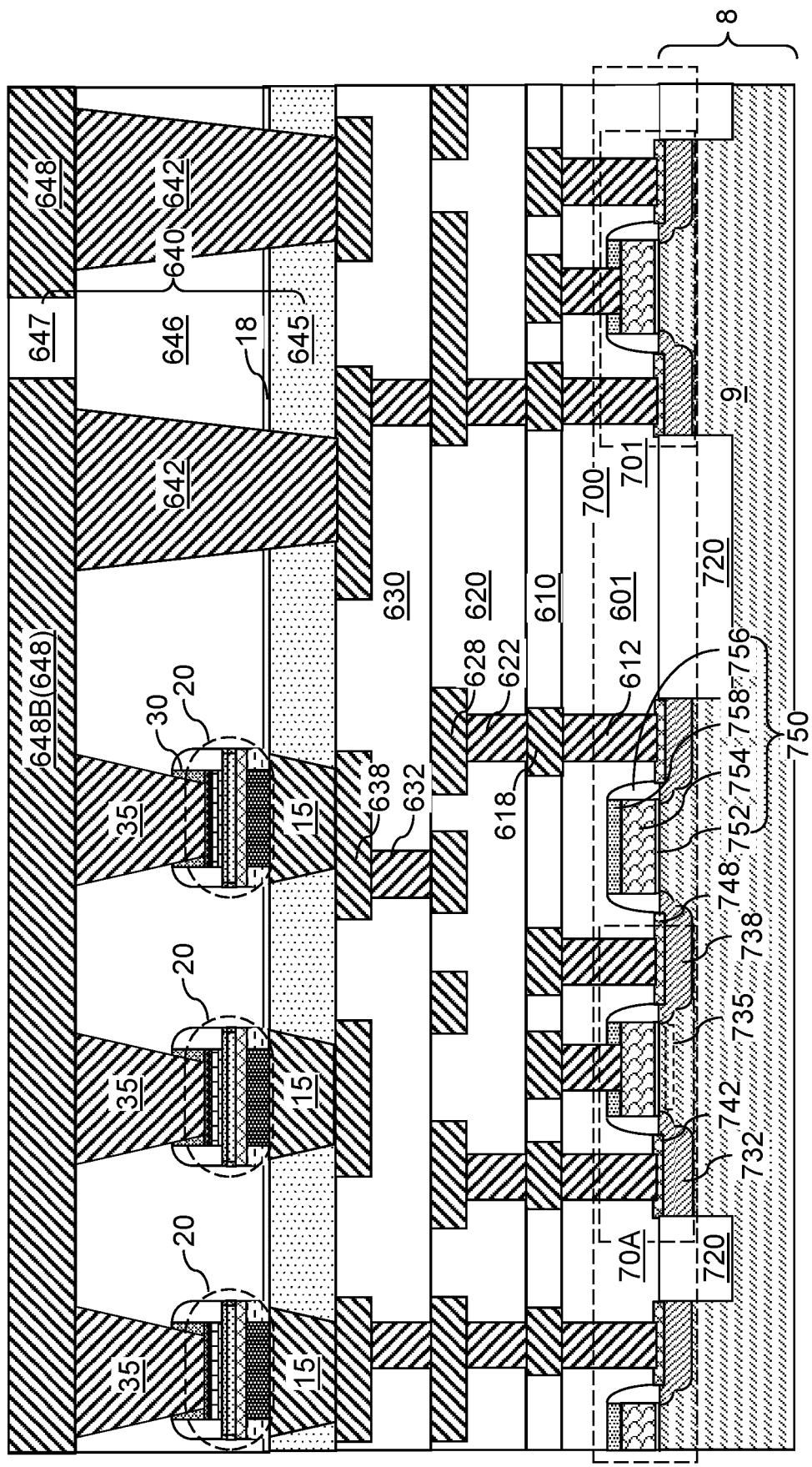
FIG. 18A is a vertical cross-sectional view of the second exemplary structure after formation of bit lines according to an embodiment of the present disclosure.
Figure 18B:
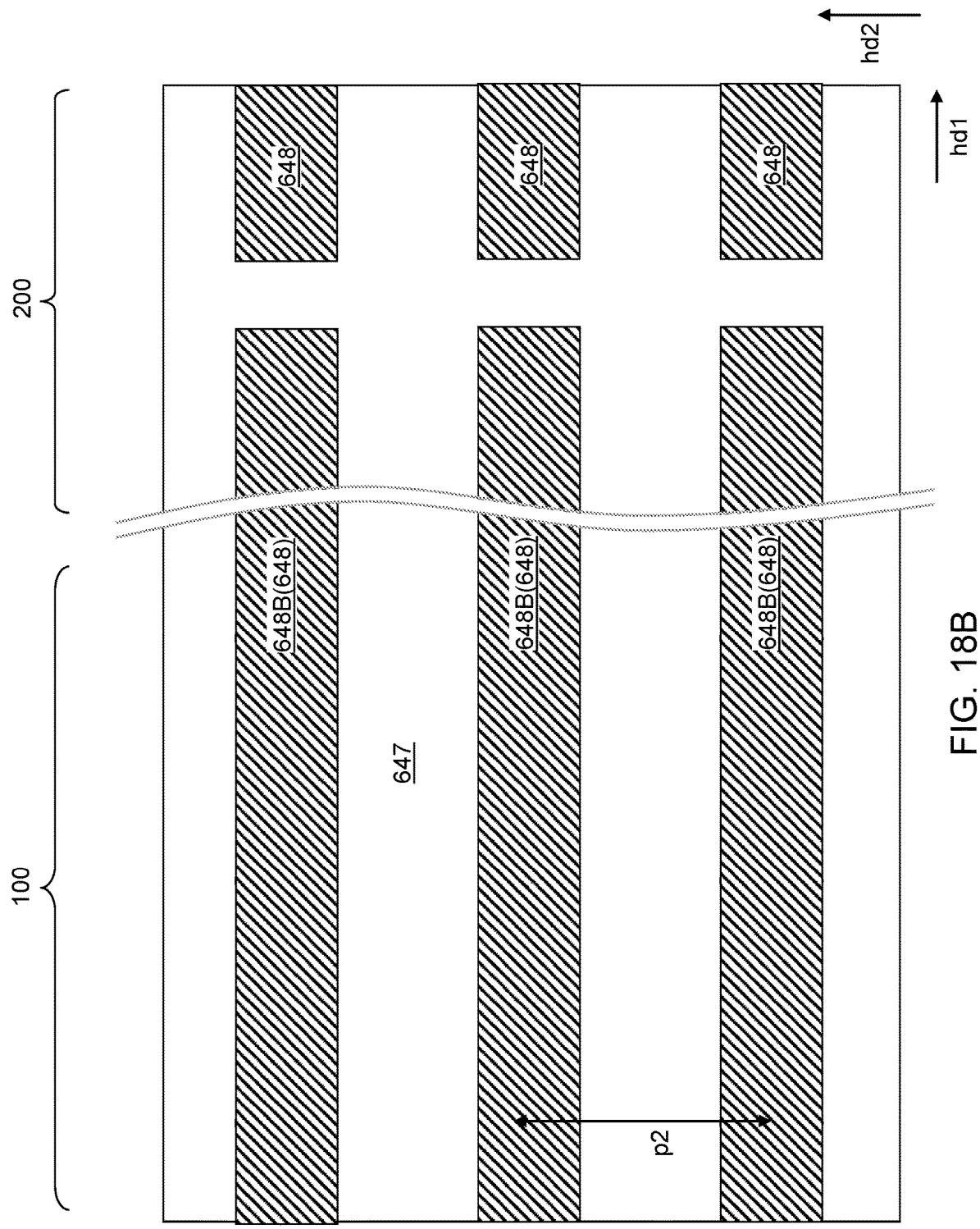
FIG. 18B is a top-down view of the second exemplary structure of FIG. 18A.

Referring to FIGS. 18A and 18B, the processing steps described with reference to FIGS. 10A and 10B may be performed to form a line-level dielectric material layer 647 and fourth metal line structures 648. The combination of the lower via-level dielectric material layer 645, the etch-stop dielectric material layer 18, the upper via-level dielectric material layer 646, and the line-level dielectric material layer 647 constitutes an interconnect-level dielectric material layer such as a fourth interconnect-level dielectric material layer 640. In one embodiment, a subset of the fourth metal line structures 648 may comprise bit lines 648B that laterally extend along the first horizontal direction hd1. Each of the bit lines 648B may contact a respective row of top connection via structures 35 arranged along the first horizontal direction hd1. In one embodiment, the bit lines 648B may be periodic along the second horizontal direction hd2 with a periodicity of the second pitch p2.

The second exemplary structure comprises a semiconductor structure. The semiconductor structure includes a two-dimensional array of memory cells 20 comprising a respective first electrode 24, a respective memory film 26, and a respective second electrode 28 that overlies a substrate 8. Each memory film 26 within the two-dimensional array of stacks comprises a respective center region (261C, 262C) in which a first average atomic ratio of the passivation element to oxygen is less than 0.01, and comprises a respective peripheral region (261P, 262P) in which a second average atomic ratio of the passivation element to oxygen is greater than 0.05.

The semiconductor structure further includes a two-dimensional array of access transistors 70A located on the substrate 8, wherein each access transistor 70A within the two-dimensional array of access transistors 70A is electrically connected to a respective memory cell 20 within the two-dimensional array of memory cells 20; and metal interconnect structures (612, 618, 622, 628, 632, 638, 15) located within dielectric material layers (601, 610, 620, 630, 645, 18) and providing electrical connection between the two-dimensional array of access transistors 70A and the two-dimensional array of memory cells 20.

In one embodiment, the metal interconnect structures (612, 618, 622, 628, 632, 638, 15) comprises a two-dimensional array of via structures (such as bottom connection via structures 15); and the dielectric material layers (601, 610, 620, 630, 645, 18) comprise an etch-stop dielectric material layer 18 contacting top surfaces of the via structures 15 within the two-dimensional array of via structures 15, and comprising a horizontally-extending portion and a two-dimensional array of vertically protruding portions.

In one embodiment, each of the vertically-protruding portions comprises a respective sidewall that is vertically coincident with a sidewall of a respective one of the first electrodes 24 and has a respective bottom periphery P that is adjoined to a respective periphery of the horizontally-extending portion; the etch-stop dielectric material layer 18 comprises a two-dimensional array of openings therethrough; and each opening through the etch-stop dielectric material layer 18 is located entirely within an area of a respective one of the first electrodes 24 in a plan view.

Figure 19:
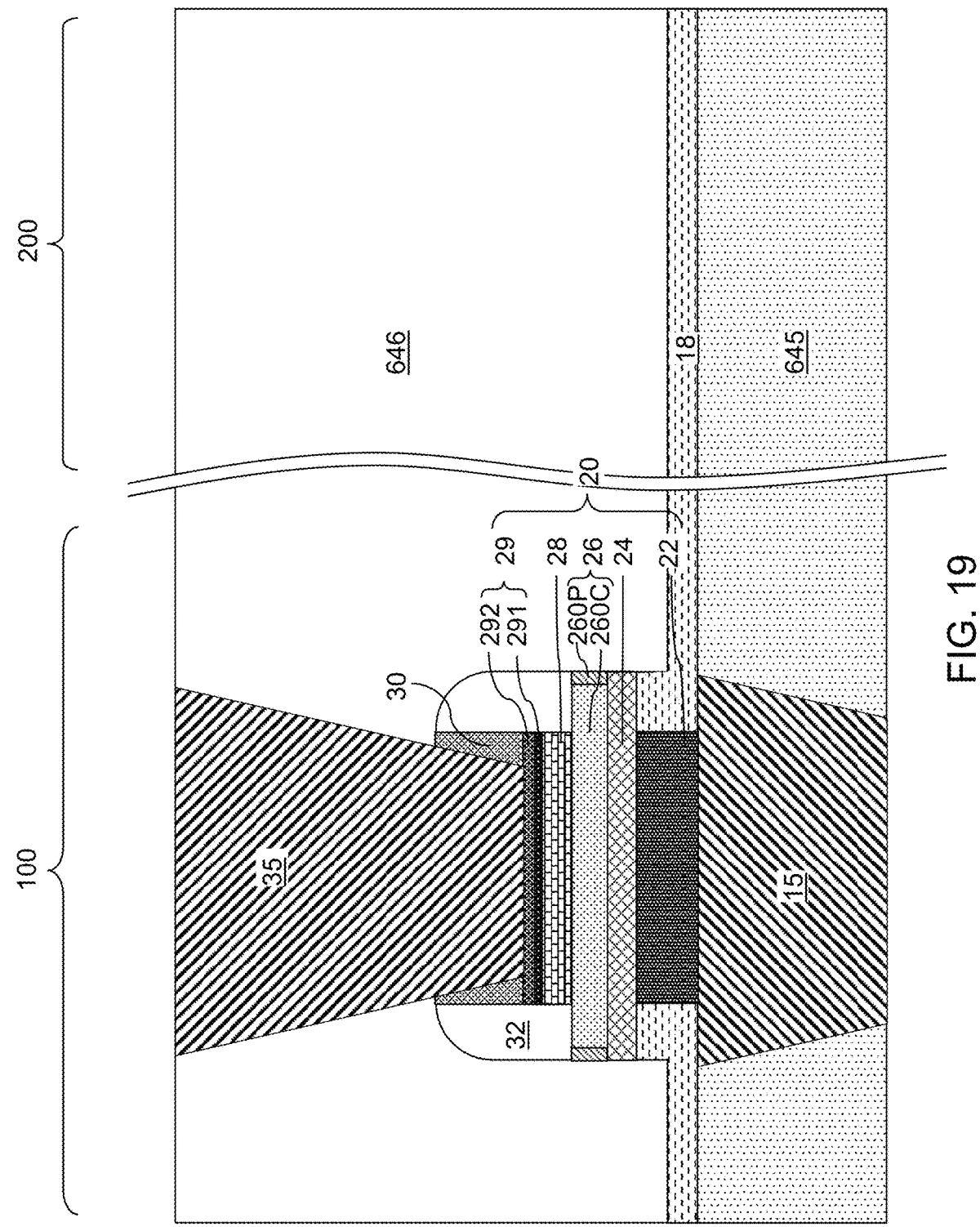
FIG. 19 is a vertical cross-sectional view of a region including a memory cell of a first alternative configuration of the second exemplary structure according to an embodiment of the present disclosure.

Referring to FIG. 19, a first alternative configuration of the second exemplary structure may be derived from the second exemplary structure by using a single dielectric metal oxide layer as a memory material layer 26L at the processing steps of FIG. 12. In this embodiment, each memory film 26 may consist of a single dielectric metal oxide layer. Each memory film 26 comprises a center region 260C and a peripheral region 260P. The center region 260C and the peripheral region 260P may have the compositions of a first center region 261C and a first peripheral region 261P as described above, respectively, or may have the compositions of a second center region 262C and a second peripheral region 262P as described above, respectively. In this embodiment, the center region of each memory film 26 may have a same material composition along a vertical direction between a first interface with the first electrode 24 and a second interface with the second electrode 28 (i.e., along the vertical direction).

Figure 20:
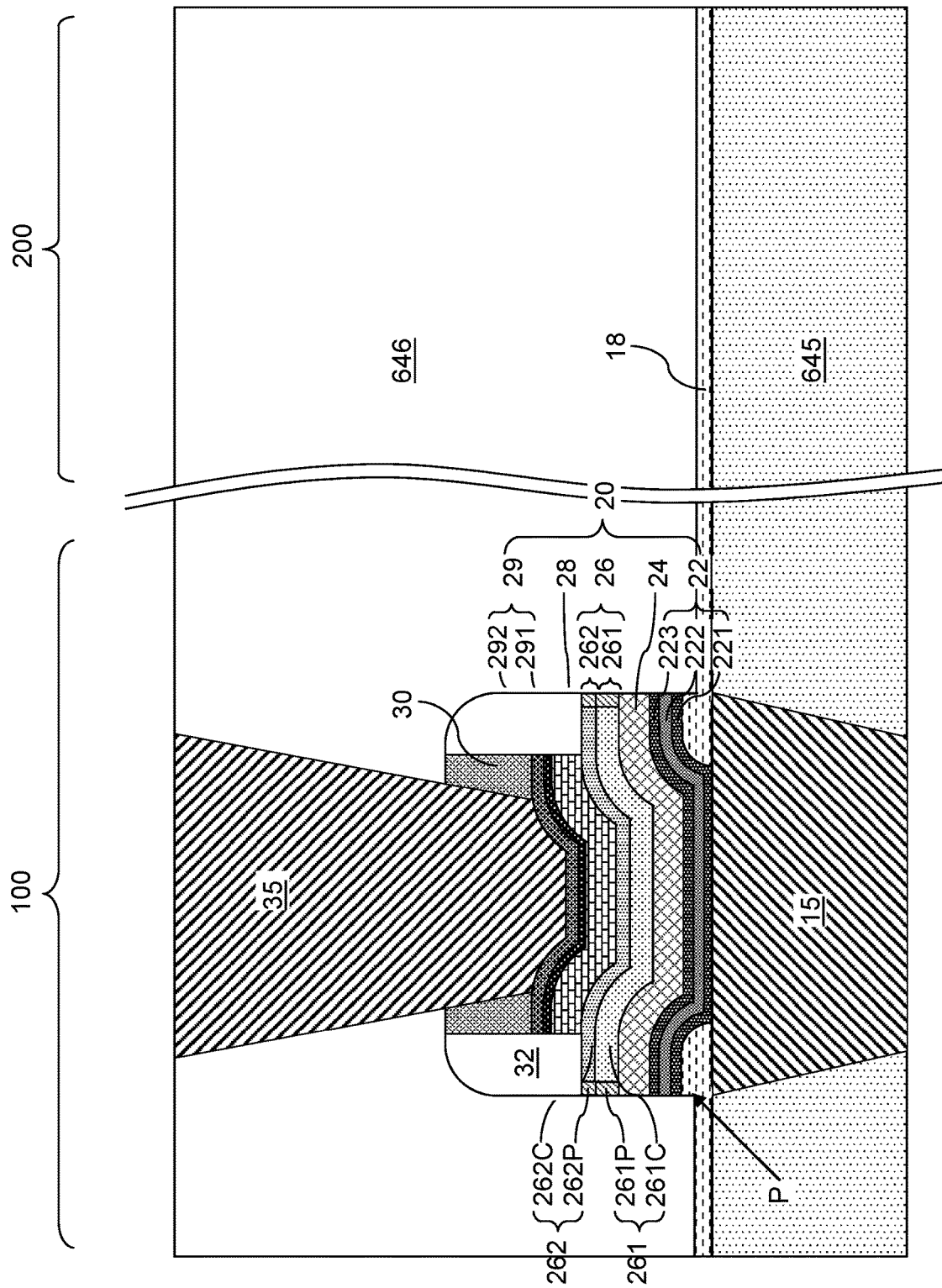
FIG. 20 is a vertical cross-sectional view of a region including a memory cell of a second alternative configuration of the second exemplary structure according to an embodiment of the present disclosure.

Referring to FIG. 20, a second alternative configuration of the second exemplary structure may be derived from the first exemplary structure illustrated in FIG. 4 by performing the processing steps described with reference to FIGS. 13, 14, 15, 16, 17A and 17B, and 18A and 18B. In the second alternative configuration of the second exemplary structure, the optional bottom metallic barrier plate 22 may comprise a stack of a first bottom metallic barrier plate 221 (which is a patterned portion of the first bottom metallic barrier layer 221L), a second bottom metallic barrier plate 222 (which is a patterned portion of the second bottom metallic barrier layer 222L), and a third bottom metallic barrier plate 223 (which is a patterned portion of the third bottom metallic barrier layer 223L). In one embodiment, each first interface between a memory film 26 and a first electrode 24 may comprise a horizontal central segment, a contoured annular segment in which a convex surface of the first electrode 24 contacts a concave surface of the memory film 26, and a horizontal annular segment adjoined to an outer periphery of the contoured annular segment. Each second interface between a memory film 26 and a second electrode 28 may comprise a horizontal central segment, a contoured annular segment in which a concave surface of the second electrode 28 contacts a convex surface of the memory film 26, and a horizontal annular segment adjoined to an outer periphery of the contoured annular segment. In one embodiment, a sidewall or sidewalls of a first electrode 24, a sidewall or sidewalls of a memory film 26, and an outer sidewall of an overlying insulating spacer 32 may be vertically coincident with one another. In an illustrative embodiment in which a memory cell 20 has a horizontal cross-sectional shape of a circle, the vertical plane may be a cylindrical vertical plane.

Figure 21:
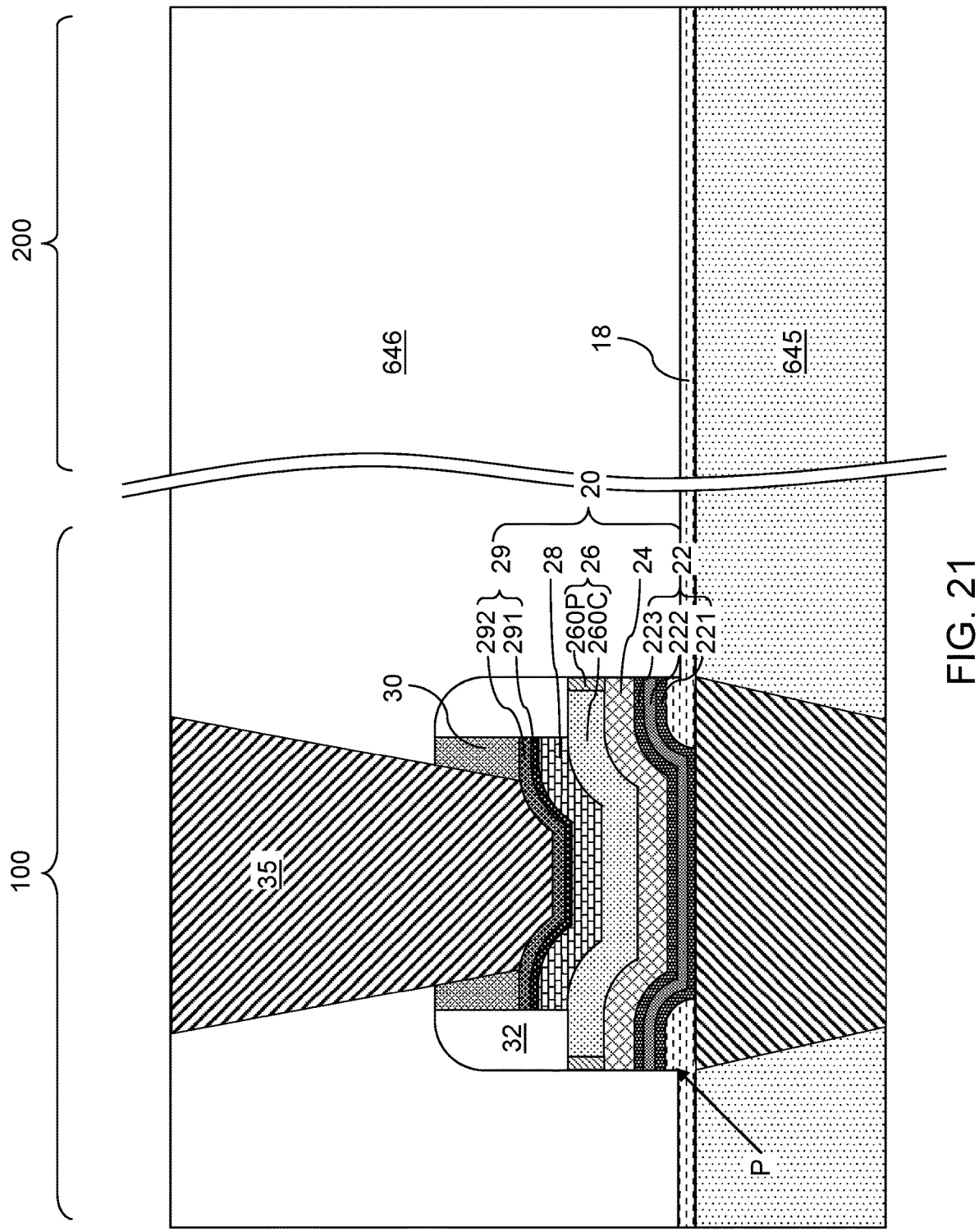
FIG. 21 is a vertical cross-sectional view of a region including a memory cell of a third alternative configuration of the second exemplary structure according to an embodiment of the present disclosure.

Referring to FIG. 21, a third alternative configuration of the second exemplary structure may be derived from the second alternative configuration of the second exemplary structure by using a single dielectric metal oxide layer as a memory material layer 26L. In this embodiment, each memory film 26 may consist of a single dielectric metal oxide layer. Each memory film 26 comprises a center region 260C and a peripheral region 260P. The center region 260C and the peripheral region 260P may have the compositions of a first center region 261C and a first peripheral region 261P as described above, respectively, or may have the compositions of a second center region 262C and a second peripheral region 262P as described above, respectively. In this embodiment, the center region of each memory film 26 may have a same material composition along a vertical direction between a first interface with the first electrode 24 and a second interface with the second electrode 28 (i.e., along the vertical direction).

Figure 22:
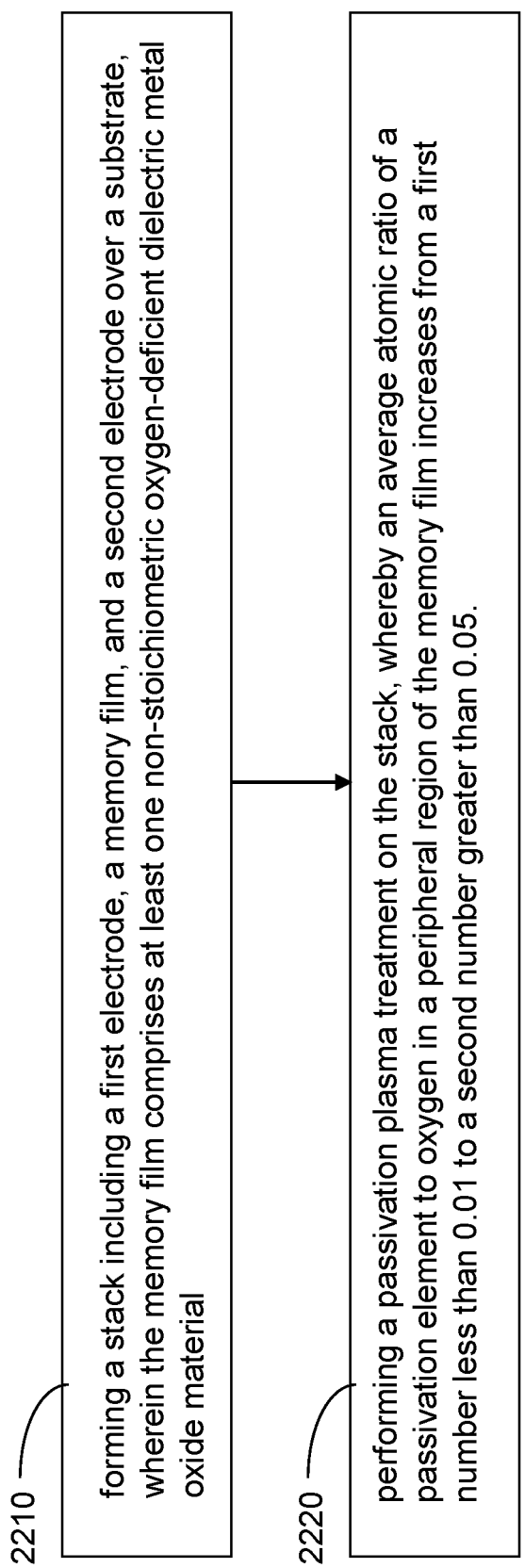
FIG. 22 is a flowchart that illustrates the general processing steps for manufacturing the semiconductor device of the present disclosure.

Referring to FIG. 22, a flowchart illustrates the general processing steps for a method of forming the semiconductor device of the present disclosure.

Referring to FIGS. 1-6B, 11, 12-16, 19, 20, and 21, a stack including a first electrode 24, a memory film 26, and a second electrode 28 may be formed over a substrate 8 in step 2210. In one embodiment, the memory film 26 comprises at least one non-stoichiometric oxygen-deficient dielectric metal oxide material.

Referring to FIGS. 7-10B, 16-18B, 19, 20, and 21, a passivation plasma treatment may be performed on the stack in step 2220. An average atomic ratio of the passivation element to oxygen in a peripheral region {(261P, 262P), 260P} of the memory film 26 increases from a first number less than 0.01 to a second number greater than 0.05.

Referring to all drawings and according to various embodiments of the present disclosure, a semiconductor structure is provided, which comprises: a first electrode 24 comprising a first metallic material; a memory film 26 comprising at least one dielectric metal oxide material and contacting the first electrode 24, wherein the memory film 26 comprises a center region {(261C, 262C), 260C} having a first average atomic ratio of the passivation element to oxygen that is less than 0.01, and comprises a peripheral region {(261P, 262P), 260P} having a second average atomic ratio of the passivation element to oxygen that is greater than 0.05; and a second electrode 28 comprising a second metallic material and contacting the memory film 26.

In one embodiment, the at least one dielectric metal oxide material comprises at least one filament-forming dielectric metal oxide material. In one embodiment, each of the at least one filament-forming dielectric metal oxide material is a non-stoichiometric oxygen-deficient dielectric metal oxide material. In one embodiment, the center region {(261C, 262C), 260C} of the memory film 26 is free of the passivation element or has a passivation element-to-oxygen ratio that is less than 0.01.

In one embodiment, the center region {(261C, 262C), 260C} of the memory film 26 has a same material composition along a vertical direction between a first interface with the first electrode 24 and a second interface with the second electrode 28.

In one embodiment, the memory film 26 comprises a layer stack including a first dielectric metal oxide material comprising a dielectric metal oxide of at least one first metal and a second dielectric metal oxide material comprising a dielectric metal oxide of at least one second metal; and the at least one second metal is different from the at least one first metal by presence of a metallic element that is not present in the at least one first metal, or by absence of a metallic element that is present in the at least one first metal.

In one embodiment, a first interface between the first electrode 24 and the memory film 26 comprises a horizontal segment; and a sidewall of the memory film 26 is vertically coincident with a sidewall of the first electrode 24. In one embodiment, the sidewall of the memory film 26 is vertically coincident a sidewall of the second electrode 28. In one embodiment, the semiconductor structure comprises an insulating spacer 32 laterally surrounding the second electrode 28, wherein an outer sidewall of the insulating spacer 32 is vertically coincident with the sidewall of the memory film 26.

In one embodiment, the peripheral region {(261P, 262P), 260P} of the memory film 26 has a passivation element concentration gradient such that an atomic concentration of the passivation element decreases with a distance from a surface of the memory film 26.

In one embodiment, the semiconductor structure comprises an etch-stop dielectric material layer 18 underlying the first electrode 24 and comprising a horizontally-extending portion and a vertically protruding portion, wherein the vertically-protruding portion comprises a sidewall that is vertically coincident with a sidewall of the first electrode 24 and has a bottom periphery that is adjoined to a periphery of the horizontally-extending portion, and wherein the etch-stop dielectric material layer 18 comprises an opening therethrough within an area of the first electrode 24 in a plan view.

According to another aspect of the present disclosure, a semiconductor structure is provided, which comprises a two-dimensional array of memory cells 20 comprising a respective first electrode 24, a respective memory film 26, and a respective second electrode 28 that overlies a substrate 8, wherein each memory film 26 within the two-dimensional array of stacks comprises a respective center region {(261C, 262C), 260C} in which an average atomic ratio of the passivation element to oxygen is less than 0.01, and comprises a respective peripheral region {(261P, 262P), 260P} in which the atomic ratio of the passivation element to oxygen is greater than 0.05.

In one embodiment, the semiconductor structure comprises: a two-dimensional array of access transistors 70A located on the substrate 8, wherein each access transistor 70A within the two-dimensional array of access transistors 70A is electrically connected to a respective memory cell 20 within the two-dimensional array of memory cells 20; and metal interconnect structures (612, 618, 622, 628, 632, 638, 15) located within dielectric material layers (601, 610, 620, 630, 645, 18) and providing electrical connection between the two-dimensional array of access transistors 70A and the two-dimensional array of memory cells 20.

In one embodiment, the metal interconnect structures (612, 618, 622, 628, 632, 638, 15) comprises a two-dimensional array of via structures 15; and the dielectric material layers (601, 610, 620, 630, 645, 18) comprise an etch-stop dielectric material layer 18 contacting top surfaces of the via structures 15 within the two-dimensional array of via structures 15, and comprising a horizontally-extending portion and a two-dimensional array of vertically protruding portions.

In one embodiment, each of the vertically-protruding portions comprises a respective sidewall that is vertically coincident with a sidewall of a respective one of the first electrodes 24 and has a respective bottom periphery that is adjoined to a respective periphery of the horizontally-extending portion; the etch-stop dielectric material layer 18 comprises a two-dimensional array of openings therethrough; and each opening through the etch-stop dielectric material layer 18 is located entirely within an area of a respective one of the first electrodes 24 in a plan view.

The various embodiments of the present disclosure may be used to increase the endurance of a memory cell 20 including an oxygen deficient filament-forming dielectric metal oxide material above 100,000 cycles, and/or above 1,000,000 cycles, and/or above 10,000,000 cycles. Further, the various embodiments of the present disclosure may be used to reduce the leakage current through the memory cell 20 by removing oxygen vacancies from peripheral regions of the memory film 26.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a first electrode comprising a first metallic material;
a memory film comprising at least one dielectric metal oxide material and contacting the first electrode, wherein the memory film comprises a center region having a first average atomic ratio of a passivation element to oxygen that is less than 0.01, and comprises a peripheral region having a second average atomic ratio of the passivation element to oxygen that is greater than 0.05, the passivation element being selected from fluorine and nitrogen;
a second electrode comprising a second metallic material and contacting the memory film; and
an insulating spacer laterally surrounding the second electrode, wherein:
an entirety of a bottom surface of the second electrode is in contact with the center region and is laterally offset inward relative to a boundary between the center region and the peripheral region; and
a top surface of the first electrode is in contact with the center region and with the peripheral region.

2. The semiconductor structure of claim 1, wherein the at least one dielectric metal oxide material comprises at least one filament-forming dielectric metal oxide material.

3. The semiconductor structure of claim 2, wherein each of the at least one filament-forming dielectric metal oxide material is a non-stoichiometric oxygen-deficient dielectric metal oxide material.

4. The semiconductor structure of claim 3, wherein the center region of the memory film is free of the passivation element.

5. The semiconductor structure of claim 1, wherein the center region of the memory film has a same material composition along a vertical direction between a first interface with the first electrode and a second interface with the second electrode.

6. The semiconductor structure of claim 1, wherein:
the memory film comprises a layer stack including a first dielectric metal oxide material comprising a dielectric metal oxide of at least one first metal and a second dielectric metal oxide material comprising a dielectric metal oxide of at least one second metal; and
the at least one second metal is different from the at least one first metal by presence of a metallic element that is not present in the at least one first metal, or by absence of a metallic element that is present in the at least one first metal.

7. The semiconductor structure of claim 1, wherein:
a first interface between the first electrode and the memory film comprises a horizontal segment; and
a sidewall of the memory film is vertically coincident with a sidewall of the first electrode.

8. The semiconductor structure of claim 7, wherein the sidewall of the memory film is vertically coincident a sidewall of the second electrode.

9. The semiconductor structure of claim 1, wherein the peripheral region of the memory film has a passivation element concentration gradient such that an atomic concentration of the passivation element decreases with a distance from a surface of the memory film.

10. The semiconductor structure of claim 1, further comprising an etch-stop dielectric material layer underlying the first electrode and comprising a horizontally-extending portion and a vertically protruding portion, wherein the vertically-protruding portion comprises a sidewall that is vertically coincident with a sidewall of the first electrode and has a bottom periphery that is adjoined to a periphery of the horizontally-extending portion, and wherein the etch-stop dielectric material layer comprises an opening therethrough within an area of the first electrode in a plan view.

11. The semiconductor structure of claim 1, wherein a first interface between the memory film and the first electrode comprises a horizontal central segment, a contoured annular segment in which a convex surface of the first electrode contacts a concave surface of the memory film, and a horizontal annular segment adjoined to an outer periphery of the contoured annular segment.

12. The semiconductor structure of claim 11, wherein a lateral boundary between the center region and the peripheral region overlies the horizontal annular surface segment of the first interface and is laterally offset outward relative to an outer periphery of the contoured annular segment of the first interface.

13. A semiconductor structure, comprising:
a two-dimensional array of memory cells, comprising:
a respective first electrode;
a respective memory film;
a respective second electrode that overlies a substrate; and
a respective insulating spacer laterally surrounding the respective second electrode and overlying the respective memory film,
wherein each memory film within the two-dimensional array of memory cells comprises:
a respective center region in which an atomic ratio of a passivation element to oxygen is less than 0.01; and
a respective peripheral region in which the atomic ratio of the passivation element to oxygen is greater than 0.05, the passivation element being selected from fluorine and nitrogen,
and wherein a lateral boundary between the respective center region and the respective peripheral region is laterally offset outward relative to a periphery of a bottom surface of the respective second electrode such that an entirety of the bottom surface of the respective second electrode is in direct contact with the respective center region, and an inner portion of a bottom surface of the respective insulating spacer is in direct contact with the respective center region.

14. The semiconductor structure of claim 13, further comprising:
a two-dimensional array of access transistors located on the substrate, wherein each access transistor within the two-dimensional array of access transistors is electrically connected to a respective memory cell within the two-dimensional array of memory cells; and
metal interconnect structures located within dielectric material layers and providing electrical connection between the two-dimensional array of access transistors and the two-dimensional array of memory cells.

15. The semiconductor structure of claim 14, wherein:
the metal interconnect structures comprise a two-dimensional array of via structures; and
the dielectric material layers comprise an etch-stop dielectric material layer contacting top surfaces of the via structures within the two-dimensional array of via structures, and comprising a horizontally-extending portion and a two-dimensional array of vertically protruding portions.

16. The semiconductor structure of claim 15, wherein:
each of the vertically-protruding portions comprises a respective sidewall that is vertically coincident with a sidewall of a respective one of the first electrodes and has a respective bottom periphery that is adjoined to a respective periphery of the horizontally-extending portion;
the etch-stop dielectric material layer comprises a two-dimensional array of openings therethrough; and
each opening through the etch-stop dielectric material layer is located entirely within an area of a respective one of the first electrodes in a plan view.

17. A semiconductor structure comprising:
a first electrode comprising a first metallic material;
a second electrode comprising a second metallic material and spaced from the first electrode;
a memory film comprising at least one dielectric metal oxide material and interposed between the first electrode and the second electrode, wherein the memory film has a non-homogeneous atomic concentration for a passivation element that is selected from fluorine and nitrogen, wherein the memory film comprises a center region having a first average atomic ratio of a passivation element to oxygen that is less than 0.01, and comprises a peripheral region having a second average atomic ratio of the passivation element to oxygen that is greater than 0.05; and
an insulating spacer laterally surrounding the second electrode, wherein:
an entirety of a bottom surface of the second electrode is in contact with the center region and is laterally offset inward relative to a boundary between the center region and the peripheral region; and
a top surface of the first electrode is in contact with the center region and with the peripheral region.

18. The semiconductor structure of claim 17, wherein the at least one dielectric metal oxide material comprises at least one filament-forming dielectric metal oxide material.

19. The semiconductor structure of claim 18, wherein each of the at least one filament-forming dielectric metal oxide material is a non-stoichiometric oxygen-deficient dielectric metal oxide material.

20. The semiconductor structure of claim 17, wherein:
the memory film comprises a layer stack including a first dielectric metal oxide material comprising a dielectric metal oxide of at least one first metal and a second dielectric metal oxide material comprising a dielectric metal oxide of at least one second metal; and
the at least one second metal is different from the at least one first metal by presence of a metallic element that is not present in the at least one first metal, or by absence of a metallic element that is present in the at least one first metal.

* * * * *